US010541038B2

(12) United States Patent
Lien et al.

(10) Patent No.: US 10,541,038 B2
(45) Date of Patent: Jan. 21, 2020

(54) SUBGROUP SELECTION FOR VERIFICATION

(71) Applicant: SanDisk Technologies LLC, Addison, TX (US)

(72) Inventors: Yu-Chung Lien, San Jose, CA (US); Xiang Yang, Santa Clara, CA (US); Zhenming Zhou, San Jose, CA (US); Deepanshu Dutta, Fremont, CA (US); Huai-Yuan Tseng, San Ramon, CA (US)

(73) Assignee: SANDISK TECHNOLOGIES LLC, Addison, TX (US)

(*) Notice: Subject to any disclaimer, the term of this patent is extended or adjusted under 35 U.S.C. 154(b) by 0 days.

(21) Appl. No.: 16/205,165

(22) Filed: Nov. 29, 2018

(65) Prior Publication Data

US 2019/0378583 A1 Dec. 12, 2019

Related U.S. Application Data

(60) Provisional application No. 62/684,112, filed on Jun. 12, 2018, provisional application No. 62/738,365, filed on Sep. 28, 2018.

(51) Int. Cl.
| | |
|---|---|
| *G11C 16/10* | (2006.01) |
| *G11C 16/34* | (2006.01) |
| *G11C 16/04* | (2006.01) |
| *G11C 16/32* | (2006.01) |
| *G11C 11/56* | (2006.01) |

(52) U.S. Cl.
CPC ...... *G11C 16/3459* (2013.01); *G11C 16/0483* (2013.01); *G11C 16/10* (2013.01); *G11C 16/32* (2013.01); *G11C 11/5628* (2013.01); *G11C 11/5671* (2013.01)

(58) Field of Classification Search
CPC ......... G11C 16/10; G11C 16/08; G11C 16/30; G11C 16/0483
USPC .......................... 365/185.22, 185.29, 230.03
See application file for complete search history.

(56) References Cited

U.S. PATENT DOCUMENTS

| | | | |
|---|---|---|---|
| 7,944,754 B2 | 5/2011 | Cernea | |
| 2010/0188767 A1* | 7/2010 | Hirose | G11B 5/09 360/31 |
| 2016/0055917 A1* | 2/2016 | Lee | G11C 16/34 365/185.11 |
| 2019/0243699 A1* | 8/2019 | Jin | G06F 11/1048 |

* cited by examiner

*Primary Examiner* — Han Yang
(74) *Attorney, Agent, or Firm* — Foley & Lardner LLP

(57) ABSTRACT

An apparatus, system, and method are disclosed for identifying and selecting a subgroup of memory cells for use during a programming or erasing operation, in order to execute the programming or erasing operation in less time, while avoiding over and under programming errors. Memory devices disclosed herein may include a state change/programming circuit, a counting circuit, a determination circuit, an identification circuit, and/or a subgroup selection circuit, where each of these circuits are configured to perform operations related to the overall process of identifying and selecting the subgroup of memory cells for utilization during a programming operation.

20 Claims, 14 Drawing Sheets

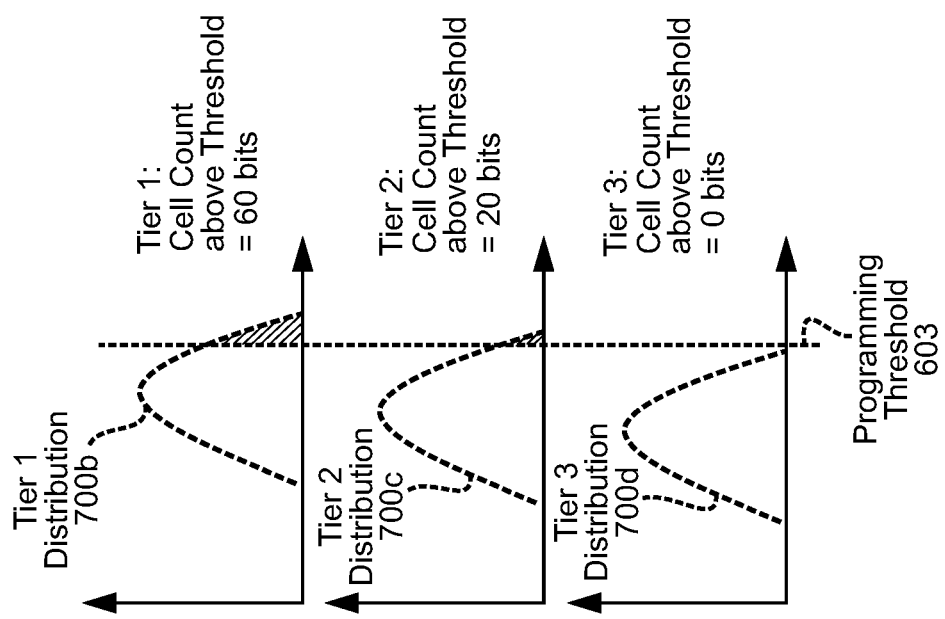
FIG. 8A
FIG. 8B
FIG. 8C
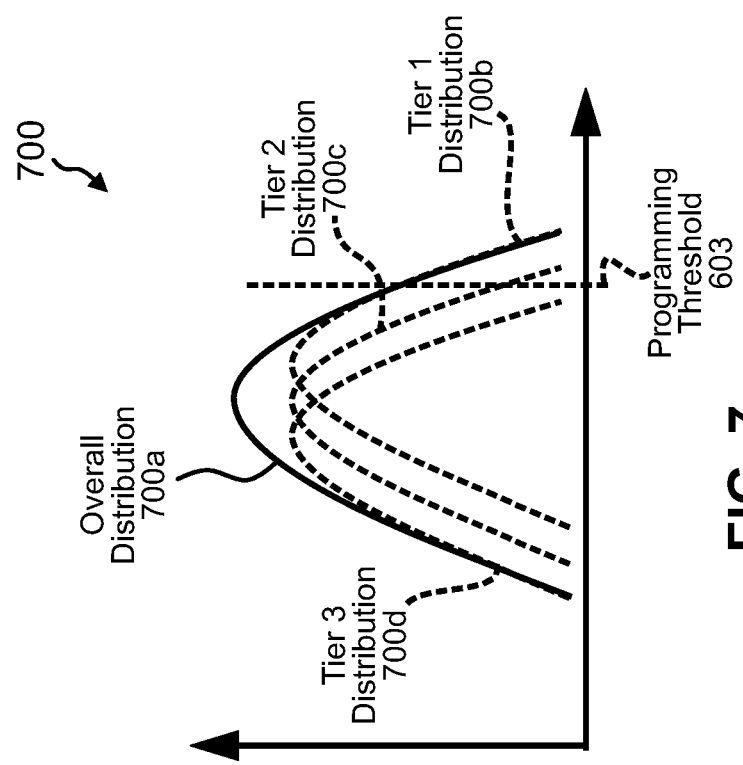
FIG. 7

US 10,541,038 B2

SUBGROUP SELECTION FOR VERIFICATION

CROSS-REFERENCE TO RELATED APPLICATIONS

The present application claims the benefit of U.S. Provisional Patent Application Ser. No. 62/684,112 entitled "PROGRAM VERIFY 10 SELECTION" filed on Jun. 12, 2018. The present application also claims the benefit of U.S. Provisional Patent Application Ser. No. 62/738,365 entitled "PROGRAM VERIFY SUBGROUP SELECTION" filed on Sep. 28, 2018. Both of the foregoing provisional patent applications are incorporated by reference as though set forth herein in their entirety.

TECHNICAL FIELD

The present disclosure, in various embodiments, relates to non-volatile and/or volatile memory device communications and more particularly relates to subgroup selection for a program verify operation for a non-volatile and/or a volatile memory device.

BACKGROUND

In a memory device, counting may be employed to determine a state of memory cells, for example, during a programming procedure. Counting all of the memory cells can be quite time-consuming. As a result, it would be beneficial to count only a portion of the memory cells during a particular operation.

BRIEF DESCRIPTION OF THE DRAWINGS

A more particular description is included below with reference to specific embodiments illustrated in the appended drawings. Understanding that these drawings depict only certain embodiments of the disclosure and are not, therefore, to be considered limiting of its scope, the disclosure is described and explained with additional specificity and detail through the use of the accompanying drawings, in which:

FIG. 7 illustrates distributions for three subgroups of memory cells, and an overall combined distribution for the three subgroups of memory cells, relative to the programming threshold shown in FIG. 6;

FIG. 8A illustrates the distribution of the fastest subgroup of memory cells of FIG. 7; FIG. 8B illustrates the distribution of the intermediate subgroup of memory cells of FIG. 7; and FIG. 8C illustrates the distribution of the slowest subgroup of memory cells of FIG. 7;

DETAILED DESCRIPTION

Figure 1:
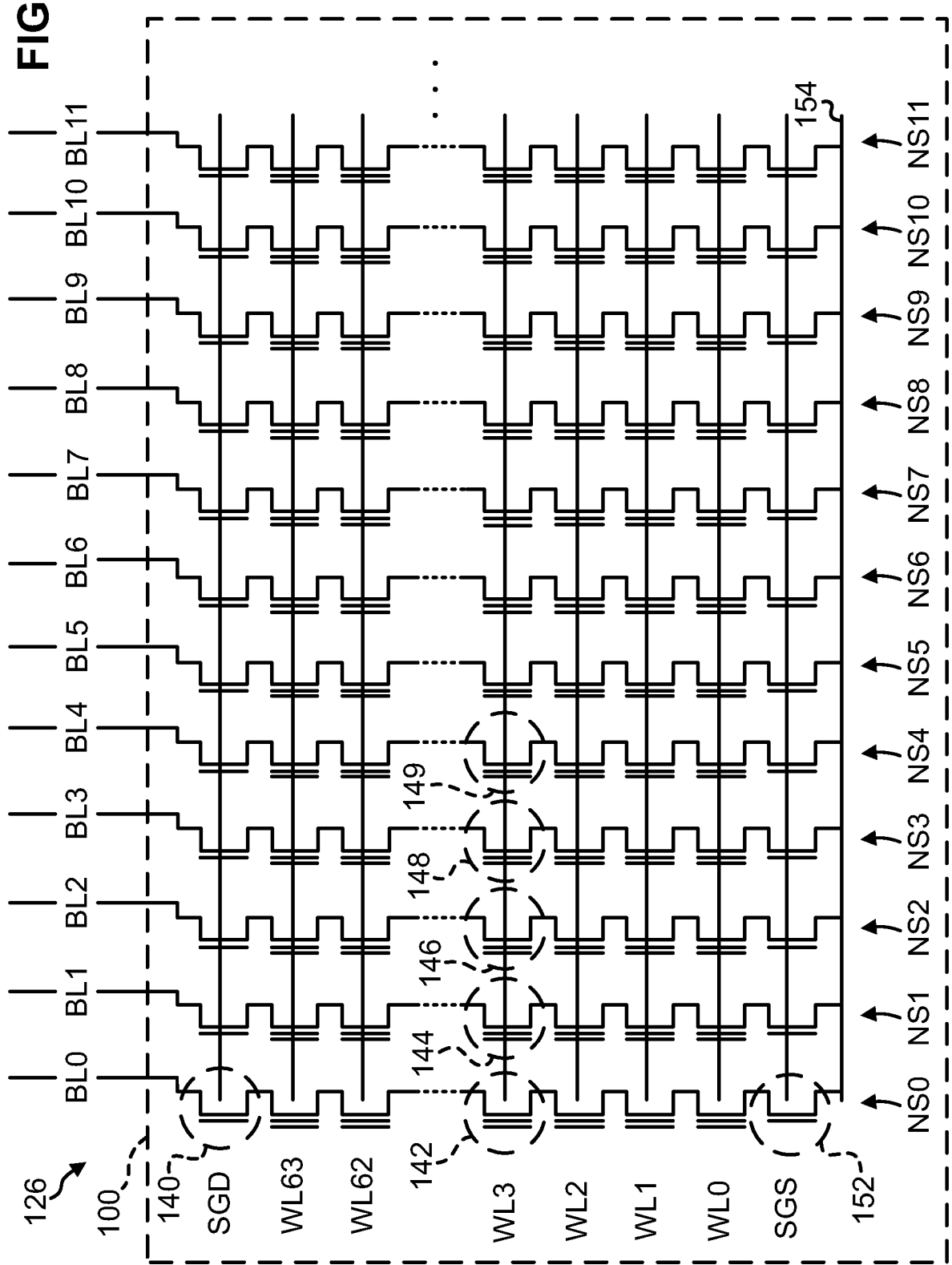
FIG. 1 illustrates an embodiment of an array of memory cells including bit and word lines.

Aspects of the present disclosure can be embodied as an apparatus, system, method, or computer program product. Accordingly, aspects of the present disclosure can take the form of an entirely hardware embodiment, an entirely software embodiment (including firmware, resident software, micro-code, or the like) or an embodiment combining software and hardware aspects that can all generally be referred to herein as a "circuit," "module," "apparatus," or "system." Furthermore, aspects of the present disclosure can take the form of a computer program product embodied in one or more non-transitory computer readable storage media storing computer readable and/or executable program code.

Many of the functional units described in this specification have been labeled as modules in order to more particularly emphasize their implementation independence. For example, a module can be implemented as a hardware circuit comprising custom VLSI circuits or gate arrays, off-the-shelf semiconductors such as logic chips, transistors, or other discrete components. A module can also be implemented in programmable hardware devices such as field programmable gate arrays, programmable array logic, programmable logic devices, or the like.

Modules can also be implemented at least partially in software for execution by various types of processors. An identified module of executable code can, for instance, comprise one or more physical or logical blocks of computer instructions which can, for instance, be organized as an object, procedure, or function. Nevertheless, the executables of an identified module need not be physically located together but can comprise disparate instructions stored in different locations which, when joined logically together, comprise the module and achieve the stated purpose for the module.

Indeed, a module of executable code can include a single instruction, or many instructions, and can even be distributed over several different code segments, among different programs, across several memory devices, or the like. Where a module or portions of a module are implemented in software, the software portions can be stored on one or more computer readable and/or executable storage media. Any combination of one or more computer readable storage media can be utilized. A computer readable storage medium can include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium can be any tangible and/or non-transitory medium that can contain or store a program for use by or in connection with an instruction execution system, apparatus, processor, or device.

Computer program code for carrying out operations for aspects of the present disclosure can be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code can execute partly or entirely on one or more of a user's computer and/or on a remote computer or server over a data network or the like.

A component, as used herein, comprises a tangible, physical, non-transitory device. For example, a component can be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component can also be implemented in programmable hardware devices such as field programmable gate arrays, programmable array logic, programmable logic devices, or the like. A component can comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, can alternatively be embodied by or implemented as a component.

A circuit, as used herein, comprises a set of one or more electrical and/or electronic components providing one or more pathways for electrical current. In certain embodiments, a circuit can include a return pathway for electrical current, so that the circuit is a closed loop. In another embodiment, however, a set of components that does not include a return pathway for electrical current can be referred to as a circuit (e.g., an open loop). For example, an integrated circuit can be referred to as a circuit regardless of whether the integrated circuit is coupled to ground (as a return pathway for electrical current) or not. In various embodiments, a circuit can include a portion of an integrated circuit, an integrated circuit, a set of integrated circuits, a set of non-integrated electrical and/or electrical components with or without integrated circuit devices, or the like. In an embodiment, a circuit can include custom VLSI circuits, gate arrays, logic circuits, or other integrated circuits; off-the-shelf semiconductors such as logic chips, transistors, or other discrete devices; and/or other mechanical or electrical devices. A circuit can also be implemented as a synthesized circuit in a programmable hardware device such as field programmable gate array, programmable array logic, programmable logic device, or the like (e.g., as firmware, a netlist, or the like). A circuit can comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, can be embodied by or implemented as a circuit.

By way of introduction, the following brief definitions are provided for various terms used in this application. Additional definitions will be provided in the context of the discussion of the figures herein. As used herein, "exemplary" can indicate an example, an implementation, and/or an aspect, and should not be construed as limiting or as indicating a preference or a preferred implementation. Further, it is to be appreciated that certain ordinal terms (e.g., "first" or "second") can be provided for identification and ease of reference and may not necessarily imply physical characteristics or ordering. Therefore, as used herein, an ordinal term (e.g., "first," "second," "third") used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") can indicate "one or more" rather than "one." As used herein, a structure or operation that "comprises" or "includes" an element can include one or more other elements not explicitly recited. Thus, the terms "including," "comprising," "having," and variations thereof signify "including but not limited to" unless expressly specified otherwise. The terms "a," "an," and "the" also refer to "one or more" unless expressly specified otherwise. Further, an operation performed "based on" a condition or event can also be performed based on one or more other conditions or events not explicitly recited. As used in this application, the terms "an embodiment," "one embodiment," "another embodiment," or analogous language do not refer to a single variation of the disclosed subject matter; instead, this language refers to variations of the disclosed subject matter that can be applied and used with a number of different implementations of the disclosed subject matter. An enumerated listing of items does not imply that any or all of the items are mutually exclusive and/or mutually inclusive, unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions can be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. Other steps and methods can be conceived that are equivalent in function, logic, or effect to one or more blocks, or portions thereof, of the illustrated figures. Although various arrow types and line types can be employed in the flowchart and/or block diagrams, they are understood not to limit the scope of the corresponding embodiments. For instance, an arrow can indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure can refer to elements of proceeding figures. Like numbers can refer to like elements in the figures, including alternate embodiments of like elements.

As opposed to counting all memory cells during a verification stage, one or more of multiple subgroups of memory cells (e.g., a tier, a tier group, a division, an input/output (TO) group, etc.) can be used. Unfortunately, for example, if the utilized subgroup is a not a suitable representation of a desired programming characteristic or criteria, data errors can occur, such as under programming or over programming. As used herein, a "memory cell" comprises a hardware component that may store a single state. The memory cell may comprise a volatile or a non-volatile memory cell. The state stored in memory cell may represent one of various types of values, such as a single-bit value or a multi-bit value FIG. 1 depicts an embodiment of memory arranged as NAND flash memory cells in a memory array 126. As used herein, the term "memory" denotes semiconductor memory. Types of semiconductor memory include volatile memory and non-volatile memory. Non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), spin-transfer torque magnetic random access memory (STT-RAM or STT-MRAM), resistive random access memory (e.g., ReRAM or RRAM) and phase change memory (e.g., PRAM or PCM). Non-volatile memory includes one or more memory cells. A "memory cell" is an electronic device or component capable of storing electronic information. In an embodiment, non-volatile memory utilizes floating-gate transistors or charge trap transistors as memory cells. The ability to adjust the threshold voltage of a floating-gate transistor or charge trap transistor to act as a non-volatile storage element or memory cell, such as a single-level cell (SLC). However, in some cases more than one data bit per memory cell (e.g., a multi-level cell) can be provided by programming and reading multiple threshold voltages or threshold voltage ranges, including a multi-level cell (MLC) (2 bits-per-cell), a triple-level cell (TLC) (3 bits-per-cell), a quad-level cell (QLC) (4 bits-per-cell), and so forth.

The memory array 126 can include many blocks of memory. A "block of memory" is a set of memory cells. For example, a block of memory (e.g., an array of memory cells) includes memory cells arranged in word lines and bit lines. A "sub-block" of memory is a subset of a block of memory. For instance, a sub-block is a subset of memory cells corresponding to a subset of the word lines of a block of memory. In an embodiment, a sub-block includes fifty word lines in a block of memory, where the block of memory includes more than fifty word lines. A sub-block can denote a physical sub-block, a logical sub-block, or both. A block of memory includes two or more sub-blocks. In an embodiment, memory is structured as two-dimensional (2D) NAND. In another embodiment, memory is structured as three-dimensional (3D) NAND. In an embodiment, one or more of the components described herein (e.g., memory die, memory, block, sub-block, memory cells, circuits, controllers, and/or non-volatile storage systems) are implemented with one or more elements (e.g., transistors, resistors, capacitors, inductors, and/or conductors) in integrated circuitry.

An illustrative block of memory (or block) 100, as shown in FIG. 1, includes a number of NAND strings NS0 to NS11 and respective bit lines (e.g., BL0 to BL11, which are shared among the blocks). Each NAND string is connected at one end to a drain select gate (SGD), and the control gates of the drain select gates are connected via a common SGD line. Each NAND string is connected at its other end to a source select gate (SGS) which, in turn, is connected to a common source line 154. For example, NS0 includes a source side select gate transistor 152 and a drain side select gate transistor 140. Example storage elements 142, 144, 146, 148, and 149 are in NS0 to NS4, respectively, and are connected to a word line WL3. For example, WL3 could be a selected word line which is selected for programming and the example storage elements can be selected storage elements which are selected for programming. Other storage elements connected to WL3 can also be selected storage elements. Sixty-four word lines, for example, WL0-WL63, extend between the source-side select gates and the drain-side select gates.

Other types of non-volatile memory in addition to NAND flash memory can also be used. For example, another type of memory cell useful in flash EEPROM systems utilizes a nonconductive dielectric material in place of a conductive floating gate to store charge in a non-volatile manner. In an embodiment, triple layer dielectric formed of silicon oxide, silicon nitride, and silicon oxide (ONO) is sandwiched between a conductive control gate and a surface of a semi-conductive substrate above the memory cell channel. The cell is programmed by injecting electrons from the cell channel into the nitride, where they are trapped and stored in a limited region. This stored charge then changes the voltage level of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor. Another type of memory uses a metallic (conductive) charge storage element in a NAND architecture.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit is localized in the dielectric layer adjacent to the source. Multi-state data storage is obtained by separately reading binary states of the spatially separated charge storage regions within the dielectric. Other types of non-volatile memory are also known. In an alternative embodiment, resistance levels rather than threshold voltage levels can be stored and sensed.

Figure 2:
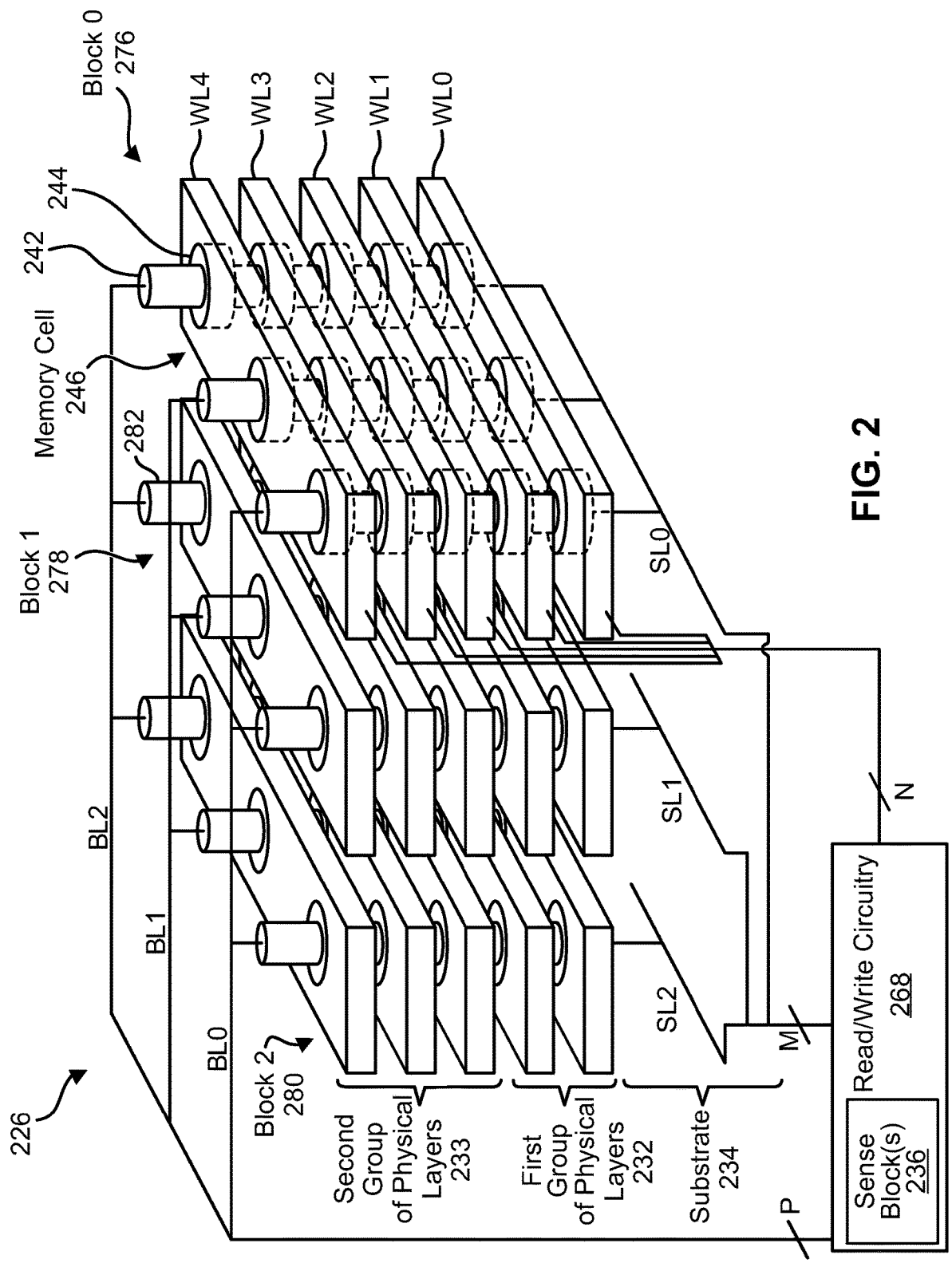
FIG. 2 illustrates a diagram of a three-dimensional (3D) memory in a NAND configuration.

FIG. 2 illustrates an embodiment of 3D memory 226 in a NAND flash configuration. The 3D memory 226 includes multiple physical layers that are monolithically formed above a substrate 234, such as a silicon substrate. Storage elements (e.g., memory cells), such as a representative memory cell 246, are arranged in arrays in the physical layers.

The representative memory cell 246 includes a charge trap structure 244 between a word line/control gate WL4 and a conductive channel 242. Charge can be injected into or drained from the charge trap structure 244 via biasing of the conductive channel 242 relative to the word line WL4. For example, the charge trap structure 244 can include silicon nitride and can be separated from the word line WL4 and the conductive channel 242 by a gate dielectric, such as a silicon oxide. An amount of charge in the charge trap structure 244 affects an amount of current through the conductive channel 242 during a read operation of the memory cell 246 and indicates one or more bit values that are stored in the memory cell 246.

The 3D memory 226 includes multiple erase blocks, including a first block (block 0) 276, a second block (block 1) 278, and a third block (block 2) 280. Each block 276, 278, 280 includes a "vertical slice" of the physical layers that includes a stack of word lines, illustrated as a first word line WL0, a second word line WL1, a third word line WL2, a fourth word line WL3, and a fifth word line WL4. Multiple conductive channels (having a substantially vertical orientation, as shown in FIG. 2) extend through the stack of word lines. Each conductive channel is coupled to a storage element in each word line WL0-WL4, forming a NAND string of storage elements. FIG. 2 illustrates three blocks 276, 278, 280, five word lines WL0-WL4 in each block 276, 278, 280, and three conductive channels in each block 276, 278, 280 for clarity of illustration. However, the 3D memory 226 can have more than three blocks, more than five word lines per block, and more than three conductive channels per block.

Read/write circuitry 268 is coupled to the conductive channels via multiple conductive lines, illustrated as a first bit line BL0, a second bit line BL1, and a third bit line BL2 at a first end of the conductive channels (e.g., an end most remote from the substrate 234) and a first source line SL0, a second source line SL1, and a third source line SL2 at a second end of the conductive channels (e.g., an end nearer to or within the substrate 234). The read/write circuitry 268 is illustrated as coupled to the bit lines BL0-BL2 via "P" control lines, coupled to the source lines SL0-SL2 via "M" control lines, and coupled to the word lines WL0-WL4 via "N" control lines. Each of P, M, and N can have a positive integer value based on the specific configuration of the 3D memory 226. In the example shown in FIG. 2, P=3, M=3, and N=5.

In a particular embodiment, each of the bit lines BL0-BL2 and each of the source lines SL0-SL2 can be coupled to the same end (e.g., the first end or the second end) of different conductive channels. For example, a particular bit line BL0-BL2 can be coupled to a first end of a conductive channel 282 and a particular source line can be coupled to a first end of the conductive channel 242. A second end of the conductive channel 282 can be coupled (e.g., electrically coupled) to a second end of the conductive channel 242. Accordingly, the conductive channel 282 and the conductive channel 242 can be coupled in series and can be coupled to the particular bit line BL0-BL2 and the particular source line SL0-SL2, each of which is coupled to a particular NAND string.

Although each of the conductive channels, such as the conductive channels 242, 282, is illustrated as a single conductive channel, each of the conductive channels can include multiple conductive channels that are in a stack configuration. The multiple conductive channels in a stacked configuration can be coupled by one or more connectors. Additionally, an etch stop layer (not illustrated in FIG. 2) having a conductive connector coupled to physically proximate portions of a conductive channel can be included in the multiple conductive channels, such as between the first group of physical layers 232 and the second group of physical layers 233. Additionally, or alternatively, one or more sub-block gate transistors (not illustrated in FIG. 2) can be coupled between the first group of physical layers 232 and the second group of physical layers 233.

In an embodiment, the first group of physical layers 232 is an example of a first sub-block and the second group of physical layers 233 is an example of a second sub-block. For example, each sub-block (e.g., "word line-based" sub-blocks) can include memory cells corresponding to a subset of word lines WL0-WL4. In an alternative embodiment, each sub-block (e.g., "string-based" sub-blocks) can include memory cells corresponding to a subset of strings (e.g., NAND strings), and can have, for example, common source lines SL0-SL2, but not common bit lines BL0-BL2 or vice versa.

The read/write circuitry 268 facilitates and/or effectuates read and write operations performed on the 3D memory 226. For example, data can be stored to storage elements coupled to a word line WL0-WL4 and the read/write circuitry 268 can read bit values from the storage elements (e.g., memory cells) using one or more sense blocks 236. As another example, the read/write circuitry 268 can apply selection signals to control lines coupled to the word lines WL0-WL4, the bit lines BL0-BL2, and the source lines SL0-SL2 to cause a programming voltage (e.g., a voltage pulse or series of voltage pulses) to be applied across selected storage element(s) of the selected word line (e.g., the fourth word line WL4).

The read/write circuitry 268 includes one or more sense blocks 236. The sense blocks 236 are utilized to read or sense one or more values stored in a memory cell. In one approach, one sense block 236 is provided for a group of NAND strings, each of which is coupled to a particular bit line BL0-BL2. For example, a sense block 236 is associated with BL0. Another sense block 236 is associated with BL1, and yet another sense block 236 is associated with BL2. Each sense block 236 can include a memory controller (not illustrated in FIG. 2). Each sense block 236 also includes a sense module for each NAND string. Alternatively, a sense block 236 can be coupled to an interval of bit lines, such as even or odd numbered bit lines.

During a read operation, a controller can receive a request from a host device, such as a computer, smartphone, or laptop computer. The controller can cause the read/write circuitry 268 to read bits from particular storage elements of the 3D memory 226 by applying appropriate signals to the control lines to cause storage elements of a selected word line to be sensed. Accordingly, the 3D memory 226 having multiple conductive channels in a stacked configuration can be configured to read from and write data to one or more storage elements.

One or more subblocks of memory cells 246 in an array of memory cells 246 can be coupled by a channel (e.g., a physical communication channel). In an embodiment, the channel comprises a bit line BL0-BL2 and/or a source line SL0-SL2.

Figure 3:
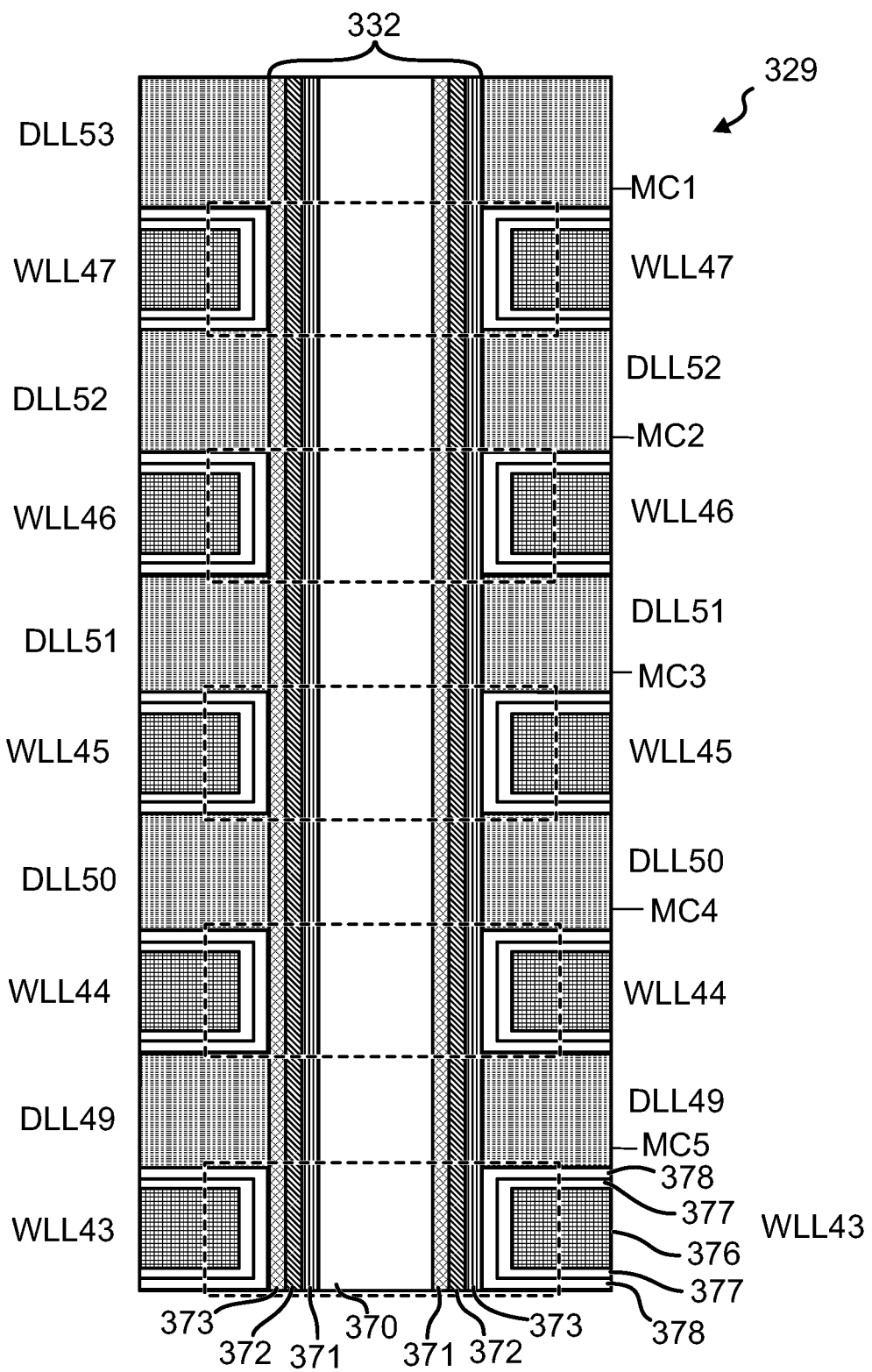
FIG. 3 is a schematic block diagram illustrating an embodiment of a 3D vertical memory structure.

FIG. 3 illustrates one embodiment of a cross-sectional view of a 3D, vertical memory structure or string 329. In one embodiment, the vertical column 332 is round and includes four layers; however, in other embodiments more or less than four layers can be included, and other shapes can be used (e.g., a "U" shape instead of an "I" shape or the like). In one embodiment, a vertical column 332 includes an inner core layer 370 that is made of a dielectric, such as SiO2. Other materials can also be used. Surrounding the inner core or inner core layer 370 is a polysilicon channel 371. Materials other than polysilicon can also be used. Note that it is the channel 371 that connects to the bit line. Surrounding the channel 371 is a tunneling dielectric 372. In one embodiment, the tunneling dielectric 372 has an ONO structure. Surrounding the tunneling dielectric 372 is a shared charge-trapping layer 373, such as (for example) Silicon Nitride. Other materials and structures can also be used. The technology described herein is not limited to any particular material or structure.

FIG. 3 depicts dielectric layers DLL49, DLL50, DLL51, DLL52, and DLL53, as well as word line layers WLL43, WLL44, WLL45, WLL46, and WLL47. Each of the word line layers includes a word line region 376 surrounded by an aluminum oxide layer 377, which is surrounded by a blocking oxide (SiO2) layer 378. The physical interaction of the word line layers with the vertical column 332 forms the memory cells. Thus, a memory cell, in one embodiment, comprises the channel 371, tunneling dielectric 372, charge-trapping layer 373 (e.g., shared with other memory cells), blocking oxide layer 378, aluminum oxide layer 377, and the word line region 376. In some embodiments, the blocking oxide layer 378 and aluminum oxide layer 377 can be replaced by a single layer of material with insulating properties or by more than two layers of different material with insulating properties. Furthermore, the materials used are not limited to silicon dioxide (SiO2) or aluminum oxide. For example, word line layer WLL47 and a portion of vertical column 332 comprise a memory cell MC1. Word line layer WLL46 and a portion of vertical column 332 comprise a memory cell MC2. Word line layer WLL45 and a portion of vertical column 332 comprise a memory cell MC3. Word line layer WLL44 and a portion of vertical column 332 comprise a memory cell MC4. Word line layer WLL43 and a portion of vertical column 332 comprise a memory cell MC5. In other architectures, a memory cell can have a different structure, however, the memory cell would still be the storage unit.

When a memory cell is programmed, electrons are stored in a portion of the charge-trapping layer 373 that is associated with the memory cell. These electrons are drawn into the charge-trapping layer 373 from the channel 371, through the tunneling dielectric 372, in response to an appropriate voltage on the word line region 376. The threshold voltage (Vt) of a memory cell is increased in proportion to the amount of stored charge. In one embodiment, the programming is achieved through Fowler-Nordheim tunneling of the electrons into the charge-trapping layer. During an erase operation, the electrons return to the channel or holes are injected into the charge-trapping layer to recombine with electrons. In one embodiment, erasing is achieved using hole injection into the charge-trapping layer via a physical mechanism such as gate induced drain leakage (GIDL).

Storage cells in the same location or position in different memory structures 329 (e.g., different memory strings 329) on different bit lines, in certain embodiments, can be on the same word line. Each word line can store one page of data, such as when 1-bit of data is stored per cell (SLC); two pages of data, such as when 2-bits of data are stored per cell (MLC); three pages of data, such as when 3-bits of data are stored per cell (TLC); four pages of data, such as when 4-bits of data are stored per cell (QLC); or another number of pages of data.

In the depicted embodiment, a vertical, 3D memory structure 329 comprises an "I" shaped memory structure 329. In other embodiments, a vertical, 3D memory structure 329 can comprise a "U" shaped structure or can have another vertical and/or stacked architecture. In certain embodiments, four sets of strings 329 (e.g., four sets of 48 word lines, or another predefined number of word lines) can form an erase block, while in other embodiments, fewer or more than four sets of strings 329 can form an erase block. As can be appreciated, any suitable number of storage cells can be part of a single string 329. In one embodiment, a single string 329 includes 48 storage cells.

Figure 4:
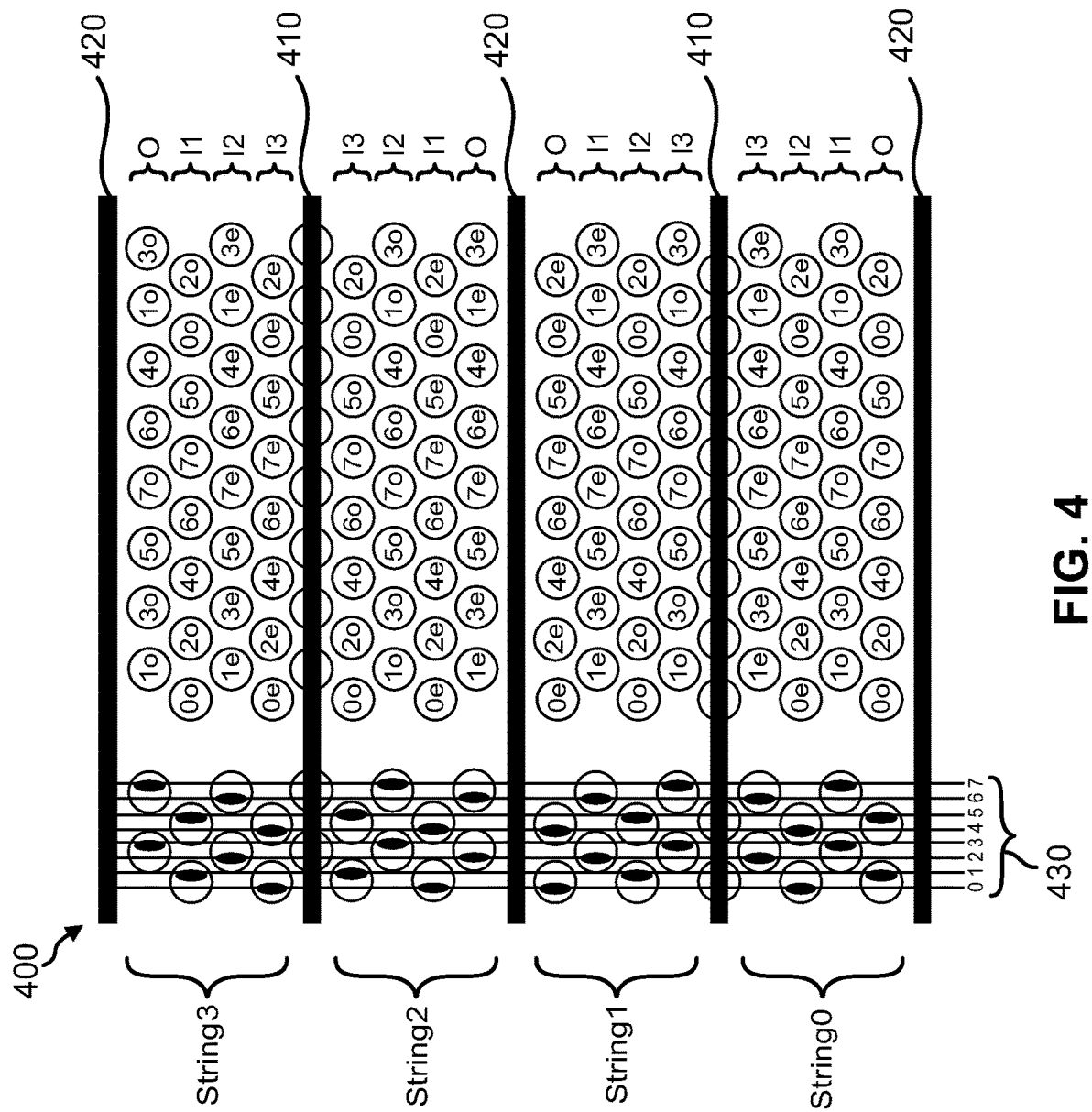
FIG. 4 is a diagram showing a top view of a 3D memory block.

FIG. 4 is a diagram illustrating a top view of a 3D memory block 400, according to one embodiment. As illustrated, the 3D memory block 400 can comprise a series of memory holes or cells (represented by circles labeled "0o" to "7o" and "0e" to "7e" in FIG. 4). Each of these memory holes can be organized into strings (labeled as "String0" to "String3" in FIG. 4) and/or further organized into IO groups (labeled as "O," "I1," "I2," and "I3" in FIG. 4). Each IO group is located between two different types of etching features formed in the 3D memory block 400, a Shallow Etching feature 410, and a Deep Etching feature 420. The IO groups adjacent to a Deep Etching feature 420 are labeled Outer IO groups (O); the IO groups adjacent to a Shallow Etching feature 410 are labeled Inner3 IO groups (I3); the IO groups adjacent to the Outer IO groups are labeled Inner1 IO groups (I1); and the IO groups adjacent to the Inner3 IO groups (I3) are labeled Inner2 IO groups (I2). It should be noted that the procedures and methods disclosed herein can be implemented in connection with a wide variety of types of memory, such as NAND or NOR memory, 2D memory, 3D memory, or memory employing a charge-based or resistive-based storage technology. In one example, the illustrated memory block 400 can comprise 16K memory cells, which can be further segregated into smaller groups of memory cells comprising 1K memory cells each.

Some manufacturing processes for 3D memory can include film deposition processes that tend to dominate over etching processes performed during manufacturing. For these types of manufacturing processes, the outer memory holes in the Outer IO groups (O) will generally program slower than the inner memory hole (I3). However, other manufacturing processes for 3D memory can include etching processes that tend to dominate over film deposition processes during manufacturing. For these types of manufacturing processes, the inner memory hole (I3) will generally program slower than the outer memory holes (O). It should be noted, however, that the physical position of an IO group of memory cells within the 3D memory structure is not always dispositive of its relative programming speed due to this variation introduced during the manufacturing process or as a result of wear induced by usage of the device. Moreover, cycling degradation can also cause the relative programming speed of different memory cells, or groups of memory cells, to shift over time.

Continuing with FIG. 4, each of the memory holes (0o-7o and 0e-7e) can be connected to bit lines 430 (labeled as bit lines 0-7 in FIG. 4). The bit lines 430 extend above the memory holes and are connected to select memory holes via connection points (illustrated as small, solid ovals in FIG. 4) indicating where a bit line 430 connects to a memory hole. For ease of illustration, only eight bit lines 430 (0 to 7) are shown in FIG. 4. However, it will be understood that other bit lines (not shown) also extend above the other memory holes in FIG. 4.

Figure 5:
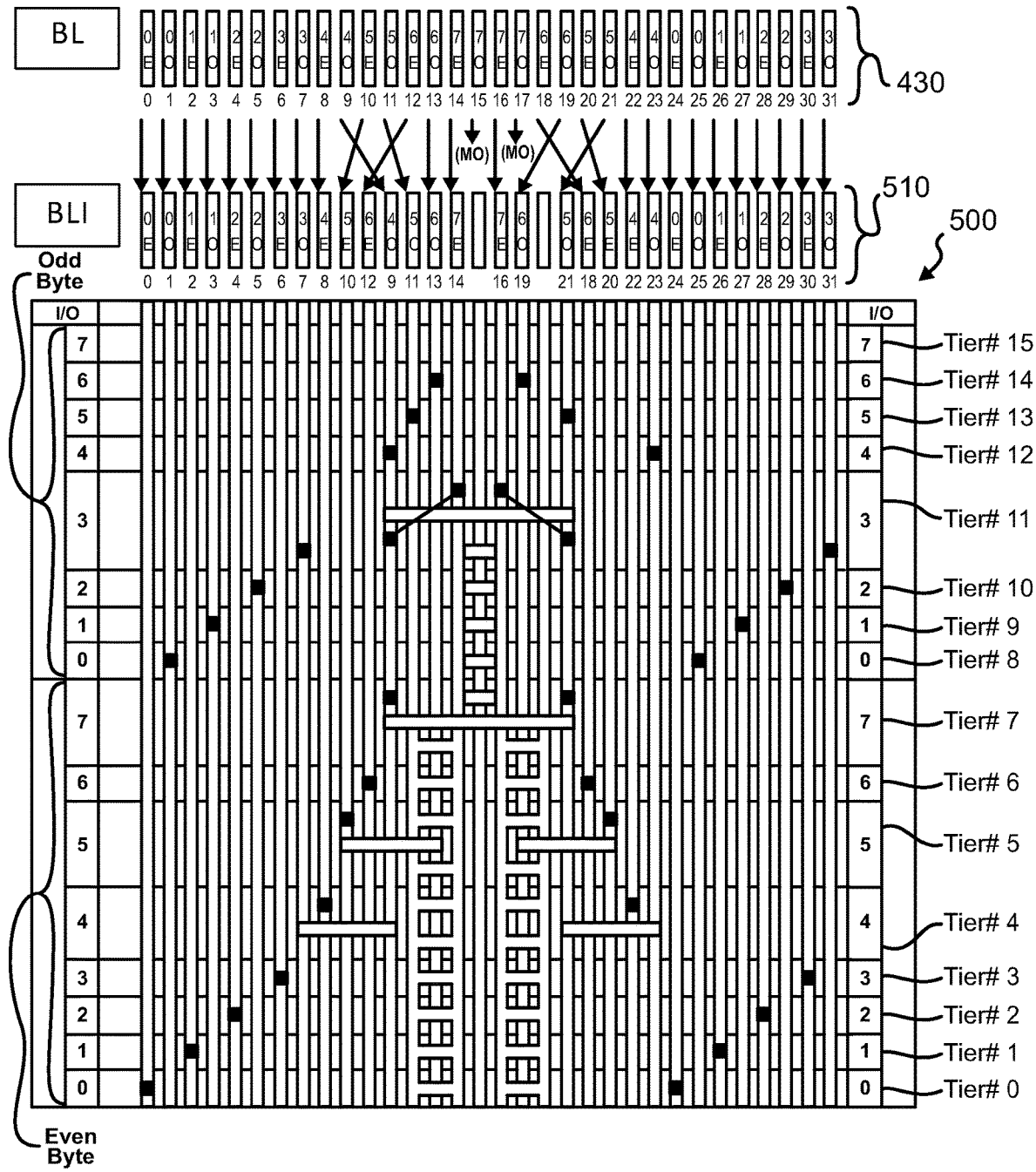
FIG. 5 is a plan view illustrating an array of sense amplifier groups for a memory device.

FIG. 5 illustrates an array of sense amplifier groups 500 for the 3D memory structure 400 of FIG. 4, according to one example. The bit lines 430 shown in FIG. 4 extend to the array of sense amplifier groups 500, as can be seen in FIG. 5. In this manner, certain memory holes of the 3D memory structure 400 can be electrically coupled to one of the bit lines 430, and each bit line can then be electrically coupled to a bit line interface 510. In an embodiment, the bit line interface 510 can additionally use scrambling, as illustrated by the angled/non-vertical lines shown in FIG. 5 between the bit lines 430 and the bit line interface 510. Thereafter, each bit line 430 can be electrically coupled to a sense amplifier group (labeled as Tier#0 to Tier#15 in FIG. 5). As illustrated in FIG. 5, each sense amplifier group extends horizontally across the page. Accordingly, each "tier" comprises a group of memory holes in electrical communication with a particular sense amplifier group via a bit line 430. A tier can also be referred to as a "subgroup of memory cells," or just a "subgroup." A "subgroup" of memory cells can be any subset of memory cells formed from a larger group of memory cells. In this application, a subgroup of memory cells can be referred to as a tier, a tier group, an IO group, a division, and the like. Thus, while "subgroup of memory cells" is one term that may be used to refer to a subset of memory cells, any of these terms (i.e., "subgroup," "memory cell subgroup," "tier," "tier group," "IO group," "division," etc.) can be interchangeably used throughout the present disclosure.

Figure 6:
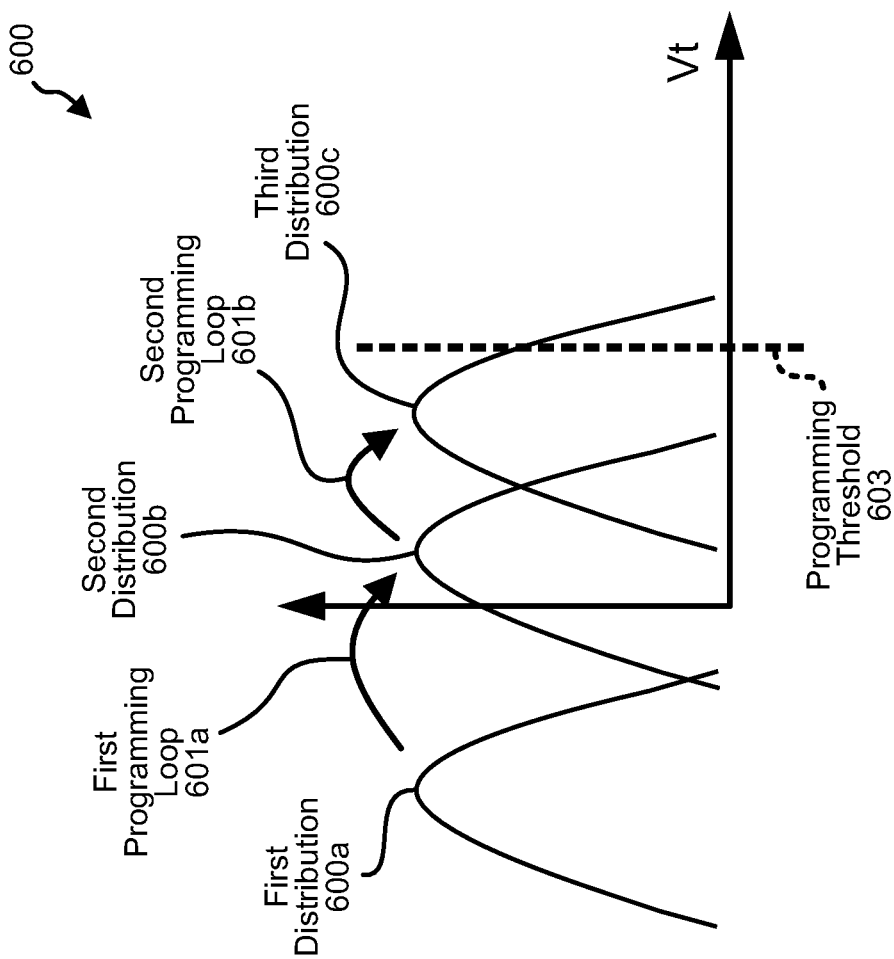
FIG. 6 illustrates various distributions for a group of memory cells during a programming operation targeting a programming threshold.

FIGS. 6-8C illustrate steps of a method for identifying the programming characteristics for one or more subgroups of memory cells. FIG. 6 illustrates various memory cell distributions 600a-c for a group of memory cells (such as a set of voltage or resistance states stored in the group of memory cells) during an example programming operation toward a particular programming threshold 603 (which may comprise a programming or erasing verification level or verify level and represents a level—such as a voltage level—at which verification may occur). As used herein, a "programming threshold" or "threshold" refers to a state or condition of a memory cell that may be reached during programming or erasing of the memory cell. For example, a "programming threshold" or "threshold" may comprise a threshold voltage level or threshold resistance level, such as a program verify level. In various embodiments, a "programming threshold" or "threshold" may be associated or unassociated with a verify level for a particular state. The example programming operation illustrated in FIG. 6 includes a first memory cell distribution 600a, a second memory cell distribution 600b (after a first programming loop 601a), a third memory cell distribution 600c (after a second programming loop 601b). A "program loop" comprises a period of time encompassing a programming pulse and extends until another programming pulse is issued, or the particular programming procedure comes to an end. Thus, a program loop encompasses a programming pulse followed by one or more verification pulses. A "verification," "verification process," "verification procedure," or "program verify operation" comprises a procedure to, for example, determine whether a particular characteristic has been satisfied in a memory cell, such as determining that a particular programming threshold 603 has been stored in a memory cell. For example, during a programming process, a programming pulse can be applied to a particular NAND memory cell. Then, a set of one or more verification pulses can be applied to, for example, determine whether the NAND cell has reached a target programming threshold 603. If not, programming pulses of a higher voltage level can be applied during the next programming loop and, within the same program loop, another verification process can be performed. This procedure is repeated until all or a portion of a page of cells are programmed to a desired programming threshold.

FIG. 7 illustrates various memory cell distributions 700a-d, including three memory cell distributions 700b-d corresponding to three different subgroups of memory cells (labeled as "Tier 1," "Tier 2," and "Tier 3" in FIG. 7), and an overall memory cell distribution 700a relative to a programming threshold 603. The overall memory cell distribution 700a shown in FIG. 7 is a combination of the memory cell distributions 700b-d for the three subgroups of memory cells labeled as Tier 1, Tier 2, and Tier 3 in FIG. 7. As shown in FIG. 7, the memory cells for Tiers 1, 2, and 3 each have different programming speeds, as noted by the relative shift in each tier's memory cell distribution 700b-d along the horizontal axis shown in FIG. 7.

FIGS. 8A-C illustrate the individual memory cell distributions 700b-d of the fastest, slowest, and intermediate tiers of memory cells from FIG. 7, relative to a programming threshold 603. Thus, certain subgroups (or tiers) of memory cells respond more rapidly or more slowly to programming pulses than other subgroups of memory cells. Likewise, certain subgroups (or tiers) of memory cells can respond more rapidly or more slowly to erasing pulses than other subgroups of memory cells. In other words, the concepts described herein apply to "programming" a memory cell or group of memory cells, as well as to "erasing" a memory cell or group of memory cells. While the physical position of a particular subgroup of memory cells on a memory substrate (as explained in connection with FIG. 4) can be indicative of its programming speed, variations in manufacturing processes and cycling degradation can also affect the programming speed of a particular subgroups of memory cell. As a consequence, it is desirable to detect which subgroup of memory cells is the fastest subgroup (represented by the distribution 700b for Tier 1 in the example provided in FIGS. 8A-C). As illustrated in FIGS. 8A-C, 60 bits in Tier 1 are above the threshold programming level 603. Alternatively, it can be desirable to detect which subgroup of memory cells is the slowest subgroup (represented by the distribution 700d for Tier 3 in the example provided in FIGS. 8A-C). As illustrated in FIGS. 8A-C, only 20 bits in Tier 2 are above the threshold programming level 603. It should also be noted that detecting which subgroups of memory cells are of intermediate programming speed (represented by the distribution 700c for Tier 2 in the example provided in FIGS. 8A-C) can also be useful for particular applications or procedures. As illustrated in FIGS. 8A-C, no bits in Tier 3 are above the threshold programming level 603. In one embodiment, a subgroup of memory cells of intermediate programming speed comprises memory cells of a programming speed between a programming speed of a fastest subgroup and a programming speed of a slowest subgroup. In other embodiments, a subgroup of an intermediate programming speed may have an equal or approximately equal (e.g., +/−1) number of subgroups in speed above or speed below the subgroup of the intermediate programming speed, considering whether there are an odd number or an even number of subgroups and whether there are any ties in programming speed. In the case of a tie (in which multiple subgroups have the same measured speed), for example, one of the subgroups of equal speed may be selected for use as a representative subgroup.

Thus, FIGS. 6-8C illustrate one embodiment of general steps for identifying a relative rate of state change for two or more subgroups of memory cells. Specifically, in FIG. 6, in one embodiment, once a certain number of memory cells satisfy (e.g., reach or exceed) programming threshold 603 (e.g., a number of memory cells reach or exceed a particular programming threshold, such as a programming threshold of a lowest state). The number of cells above the programming threshold 603 are counted to determine the relative programming speed for each subgroup/tier. As illustrated in FIGS. 8A-C and as indicated above, for Tier 1, 60 bits are above the programming threshold; for Tier 2, 20 bits are above the programming threshold; and, for Tier 3, 0 bits are above the programming threshold. Thus, in this example, Tier 1 is the fastest programming tier, Tier 3 is the slowest programming tier, and Tier 2 is an intermediate or medium speed programming tier.

In the example illustrated in FIGS. 7-8C, the speed at which the memory cells respond to a programming pulse is a rate of state change for the memory cells in each tier. The rate of state change (e.g. programming speed) of each tier is compared against the other tiers to determine a relative rate of state change. In this example, Tier 1 is identified as the fastest subgroup of memory cells. Tier 2 is identified as an intermediate programming speed subgroup of memory cells. And, Tier 3 is identified as the slowest subgroup of memory cells.

Depending on the procedure, a fastest, slowest, or intermediate subgroup of memory cells can be identified for use in a current or future memory operation, such as a programming operation. In this manner, an adaptive scan or counting can be performed utilizing a subgroup of memory cells that satisfies a particular programming criterion, programming characteristic, or state change characteristic that specifies whether a fast, slow, or intermediate subgroup of memory cells is desired for a particular storage operation.

As used herein, a "state change characteristic" comprises any attribute relating to a memory cell as the memory cell transitions from one state to another state. For example, a state change characteristic may comprise, but is not limited to, speed, momentum, polarization, resistance, temperature, crystalline composition, amorphous composition, and the like.

Thus, for example, one state change characteristic may involve a speed at which a memory cell, or a set of memory cells, changes from a first state to a second state during programming or erasing in response to common or similar programming or erasing pulses. In one embodiment, a state change characteristic may simply comprise a characteristic reflecting how quickly or slowly a particular memory cell or set of memory cells respond to a set of one or more programming pulses (i.e., how quickly a stored state is altered in response to a programming pulse).

Figure 9A:
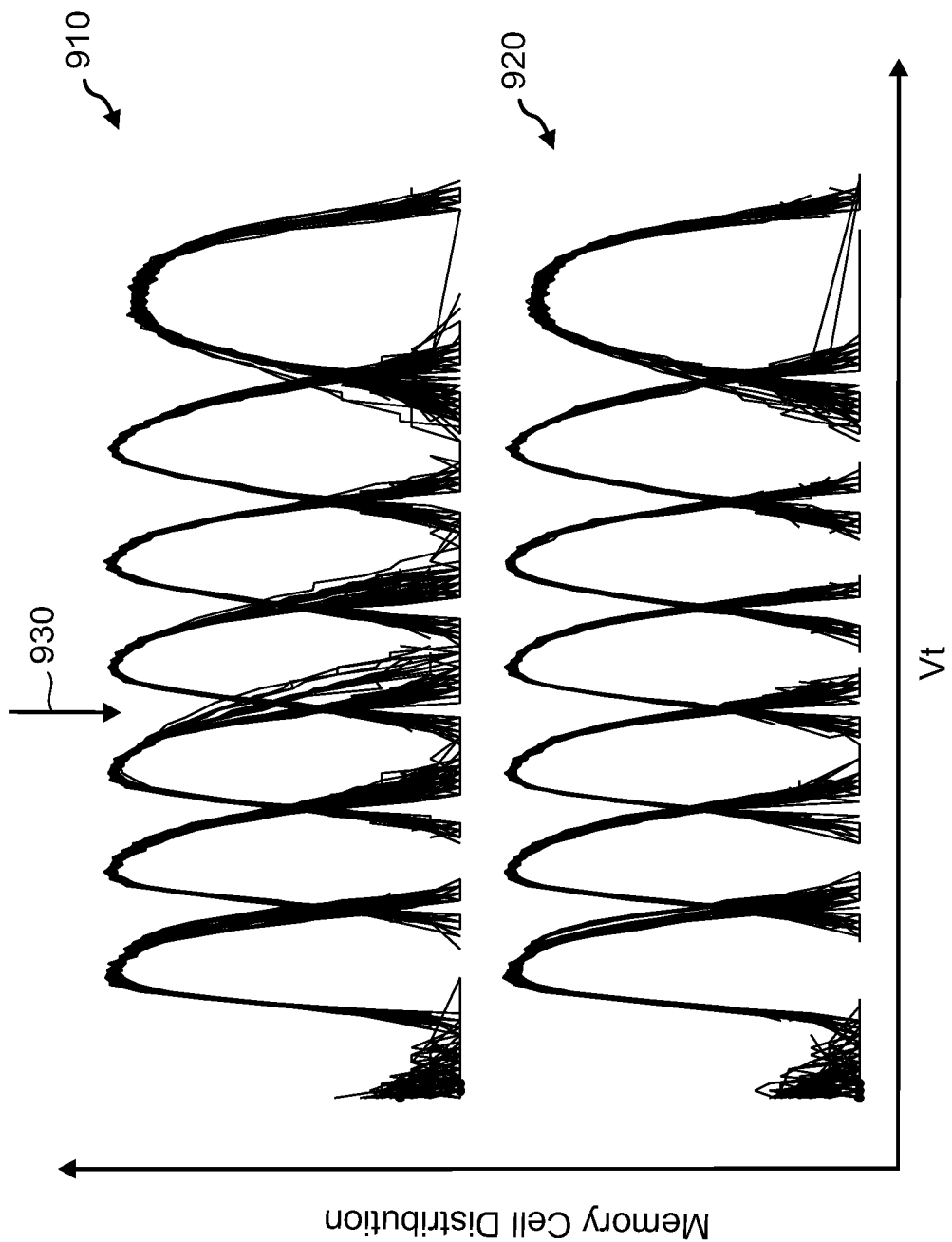
FIG. 9A illustrates various distributions for a group of memory cells including a conventional single-subgroup scan in which over programming occurs and a set of distributions using an all-subgroup scan.

FIG. 9A illustrates a first set of memory cell distributions 910 generated using a conventional single-subgroup scan (in which no determination is made as to which subgroup is the fastest), and a second set of memory cell distributions 920 using an all-subgroups scan (in which all of the memory cells are counted—i.e., scanned). The all-subgroup scan produces an acceptable set of distributions 920, but scanning all of the subgroups is too time-consuming and results in a slower programming or erasing process. In contrast, the conventional single-subgroup scan produces a poor set of distributions 910. The arrow 930 in FIG. 9A identifies an area in the first set of distributions 910 in which over programming as illustrated, which may result when a subgroup is presumed to be the fastest subgroup but is not. (Please note how some of the upper tails in the memory cell distribution 910 set indicated by the arrow 930 appear to spread out and move towards the right in FIG. 9 into the next highest state.) By comparison, the second set of memory cell distributions 920 does not exhibit these programming errors. Likewise, for under programming errors (illustrated in the FIG. 9B), the lower tails of a memory cell distribution set would appear to spread out and move towards the left in FIG. 9B, into an adjacent and lower distribution as shown in arrow 940. Under programming errors may occur when, for example, a subgroup is assumed to be the slowest subgroup, but is not. Some of the causes of over/under programming errors will be discussed in more detail below, along with the presentation of embodiments that alleviate these over/under programming errors. It should also be noted that under and over programming errors do not necessarily occur in the highest or lowest data states but may occur in connection with other, intermediary data states.

During a verification process it is time-consuming to count the entire population of memory cells for each tier. Accordingly, a subgroup of memory cells can be selected for counting (sometimes referred to as scanning). Scanning is utilized to verify the programming status (or current state) of memory cells, for example, during a programming procedure. Scanning is done to determine whether the memory cells have reached a target data state or threshold. When the target programming threshold is reached, programming for those cells can be stopped; if the target programming threshold has not been reached, programming will continue until the target is reached. Thus, in one embodiment, one or more initial program pulses followed by scanning can be used during a programming procedure to ascertain which subgroup of memory cells to select for scanning operations. Alternatively, a subgroup of memory cells can be selected based on information obtained from a prior programming procedure, such as during a manufacturing or calibration procedure.

In certain 3D NAND flash technology, the program verify operation can use a "1-Tier Bitscan" method (which may also be referred to as a single-subgroup scan), or the like, meaning a controller scans only a subset of memory cells on a page of data to determine whether a target programming level (or threshold) has been reached instead of instead of scanning all of the cells on the page. It should be noted that whether a single-subgroup scan or an all-subgroup scan is employed, in many cases, not all of the cells will reach target programming threshold because some of the cells are defective or simply too slow in responding to applied programming pulses. In one embodiment, the memory cells of a page are organized into subgroups of memory cells (e.g., tiers, IO groups, divisions, etc., as previously discussed). For example, if a page includes 16 KB of memory cells, the page can be divided into 16 tiers, with each tier including 1 KB of memory cells of the page. A "1-Tier Bitscan" verify operation may select one tier, out of the 16 tiers, to perform a representative program verify operation that serves to verify all other tiers based on the assumption that the selected tier exhibits a desired relative programming speed for the program verify operation. Thus, ideally, the behavior of the selected tier makes it a good representative for all other tiers that together comprise the whole page.

As previously discussed with reference to FIGS. 4 and 5, in an embodiment of a 3D memory architecture, the memory cells can be organized into four IO groups (e.g., an inner1 IO, an inner2 IO, an inner3 IO, an outer IO, or the like). Outer IO groups can be those memory cells that are physically located along the outer edges of the array of memory cells (adjacent to a deep etching), and Inner IO groups can be those memory cells that are physically located nearer the center of the array of memory cells (adjacent to a shallow etching). In one embodiment of a "1-Tier BITSCAN" method, an outer IO group or an inner IO group can be selected to be a default IO group representative of other IO groups during a program verify operation. In such an embodiment, the default IO group can always be used to perform certain program verify operations, such that the other unselected IO groups do not need to undergo the same program verify operations, as it is assumed and believed that the results of the program verify operations for the default IO group can be relied upon as a good representative for all other IO groups. For example, a representative default IO group can be assumed to be a fastest (or slowest) programming subgroup of memory cells among a plurality of subgroups.

In another embodiment, selecting the fastest IO group for certain program operations can ensure that memory cells are not over programmed in order to avoid the over programming errors previously discussed. If, however, a slower IO group is erroneously selected to represent all 10 groups for certain program operations, the memory array can exhibit over programming errors (e.g., a memory cell distribution with an extended and/or improper upper tail) after the program operation has finished.

Figure 10:
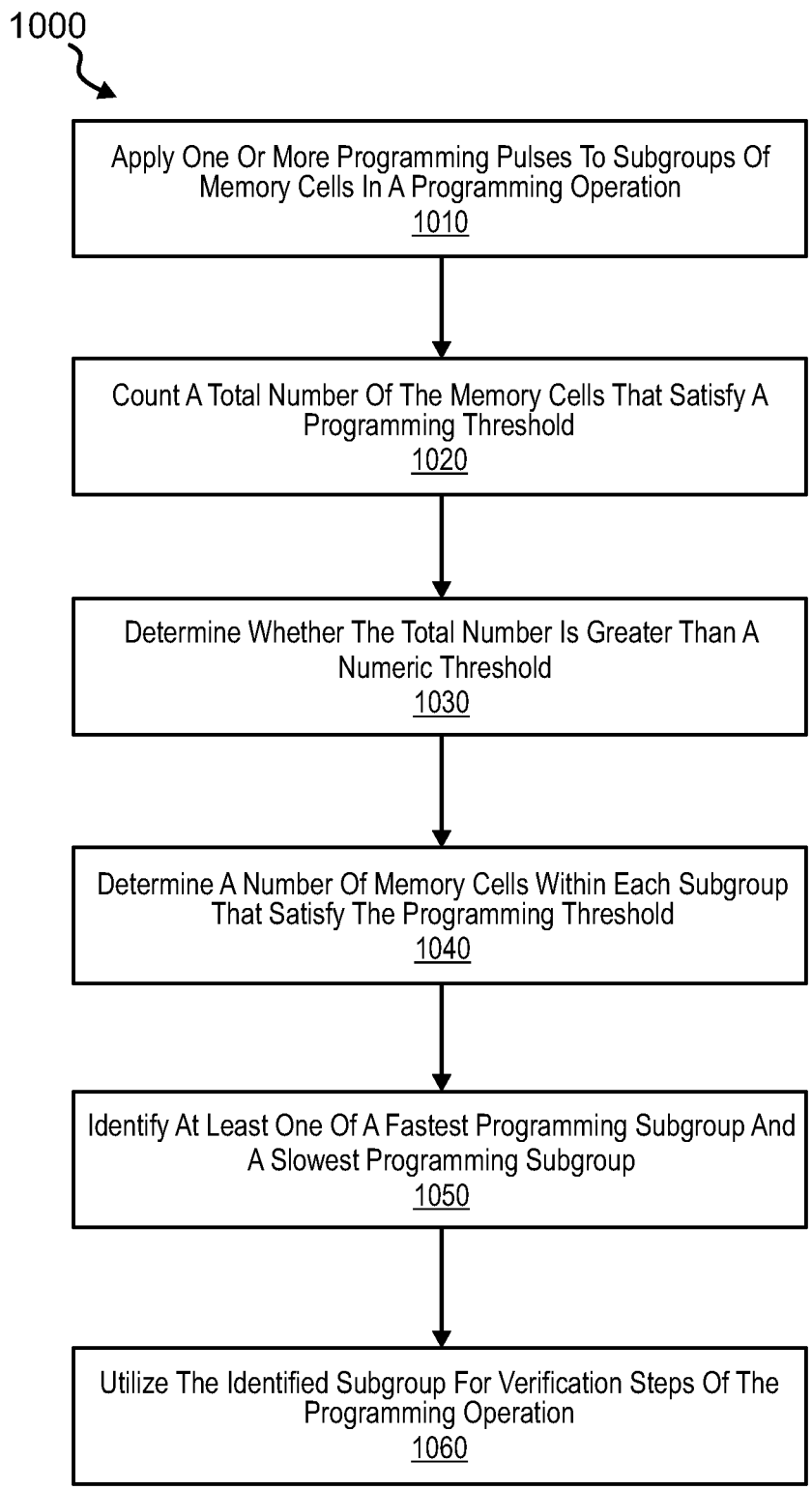
FIG. 10 is a flow diagram illustrating an embodiment of a method for identifying a relative programming speed of a subgroup of memory cells.

FIG. 10 is a flow diagram illustrating an embodiment of a method 1000 for identifying a relative programming speed of a subgroup of memory cells. The identified subgroup of memory cells can then be used in a programming operation, such as for verification steps in an adaptive, smart tier scan. The method 1000 can be used with any of the memory devices and systems disclosed herein, as well as any other suitable memory devices and systems that may be envisioned.

In a step 1010, one or more programming pulses can be applied to subgroups of memory cells in a programming operation. The programming operation can target a desired programming threshold for at least some of the memory cells within the subgroups of memory cells by applying one or more programming loops (e.g., a programming pulse followed by one or more verification pulses), as previously described.

In a step 1020, a total number of the memory cells that satisfy a programming threshold (e.g., a particular threshold voltage level, threshold resistance level, or the like) can be counted before, during, or after each verification pulse in order to determine (in a step 1030) whether the total number of memory cells that satisfy the programming threshold is greater than a numeric threshold (e.g., a pre-determined number, a percentage of the total number of memory cells, etc.). In this manner, subsequent steps of the method 1000 can be delayed/avoided until a sufficient sample size of memory cells that satisfy the numeric threshold is obtained.

In a step 1040, if it is determined that the total number of memory cells that satisfy the programming threshold is greater than the numeric threshold (as determined in step 1030), then a number of memory cells within each subgroup that satisfy the programming threshold can be determined/counted. For example, as previously discussed with reference to FIGS. 8A-C, it was determined that a first subgroup (Tier 1) had 60 bits above the programming threshold, a second subgroup (Tier 2) had 20 bits above the programming threshold, and a third subgroup (Tier 3) had 0 bits above the programming threshold.

Once the number of memory cells within each subgroup that satisfy the programming threshold has been determined/counted, the method 1000 can proceed to a step 1050 in which at least one relative programming speed for a subgroup of memory cells can be identified, based on the determined number of memory cells within each subgroup above a particular programming threshold. In an embodiment, at least one of a fastest programming subgroup and a slowest programming subgroup are identified, based on the determined number of memory cells within each subgroup. Additionally, a subgroup of intermediate programming speed may be identified.

Once the at least one subgroup of memory cells has been identified, the method 1000 can proceed to a step 1060 in which the identified subgroup of memory cells can be utilized for verification steps in a programming operation, as previously described, and the method 1000 may end.

Figure 9B:
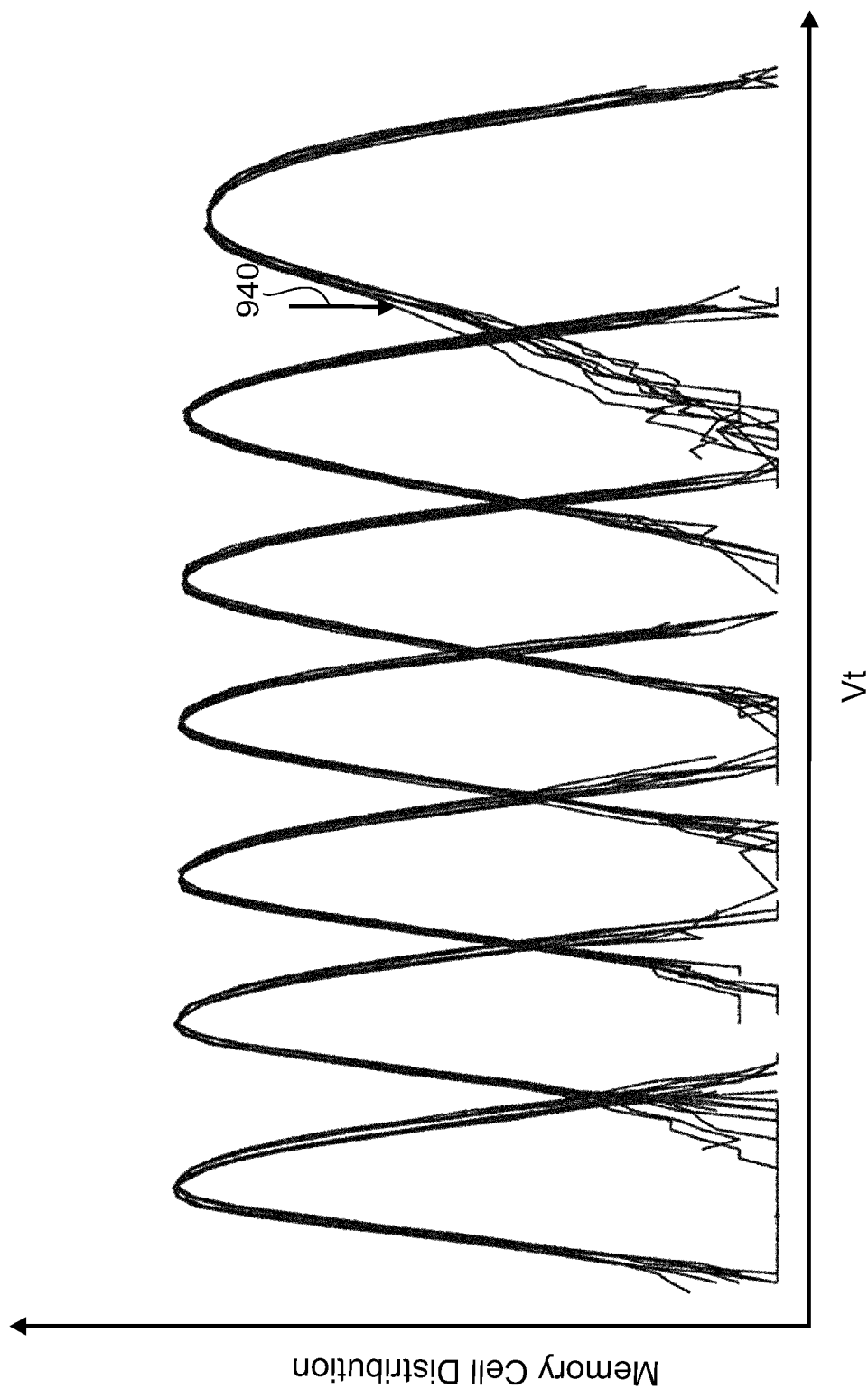
FIG. 9B illustrates a set of distributions in which under programming occurs during a single-subgroup scan.

As previously discussed, using all of the subgroups for scanning in order to determine whether a target data state for a set memory cells has been reached is time-consuming and unduly slows down programming or erasing. Accordingly, one subgroup can be selected for scanning based on the determination that the selected subgroup is representative of the desired attribute (e.g., the subgroup is the fastest, slowest, or an intermediate subgroup). In conventional approaches, a particular IO group or tier was generally regarded as being the slowest or fastest (e.g., the outer IO group or the inner3 IO group). However, this assumption was not always accurate and resulted overlapping distributions, as illustrated in FIGS. 9A-9B. As previously discussed with reference to FIG. 9A, over programming can result if, for example, a subgroup is selected as being the fastest subgroup, but is not the fastest subgroup. Alternatively, if a subgroup is selected as being the slowest subgroup but is not the slowest subgroup, under programming can result. As a consequence, as outlined above, a subgroup (e.g., tier, tier group, JO group, division, etc.) of memory holes or memory cells can be identified based on a determination of programming speed for each subgroup. Thereafter, programming operations (such as verification) can be implemented by utilizing an identified subgroup as representative of all other subgroups. Thus, the term "program verify subgroup selection" can refer to any system, method, or apparatus disclosed herein for identifying a subgroup of memory cells (e.g., a tier, tier group, JO group, division, etc.) having a particular characteristic (e.g., a slowest or fastest subgroup) to be utilized during a programming operation (e.g., scanning during verification, etc.).

Figure 11:
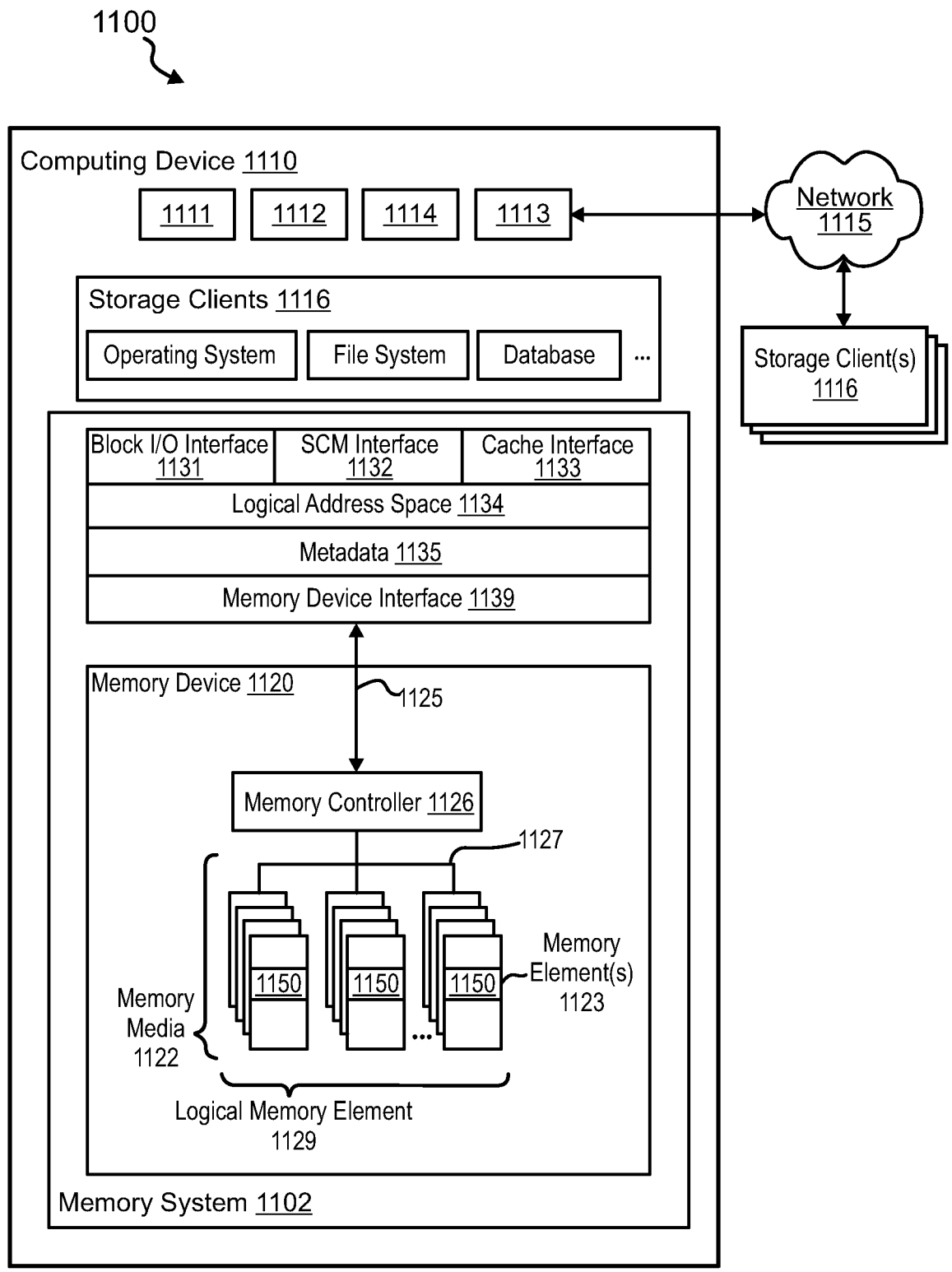
FIG. 11 is a schematic block diagram illustrating an embodiment of a system for memory cell subgroup identification and selection.

FIG. 11 is a schematic block diagram illustrating an embodiment of a system 1100 and device 1110 for memory cell subgroup identification and selection. The computing device 1110 comprises one or more identification circuits or subgroup selection circuits 1150 for memory media 1122 of a non-volatile and/or volatile memory device 1120. As used herein, an "subgroup selection circuit" refers to a circuit utilized to identify a programming speed for a subgroup of memory cells (e.g., an IO group or a tier group of memory cells) in relation to at least one other subgroup of memory cells and select the identified subgroup of memory cells for use in at least one programming operation. For example, the subgroup selection circuit 1150, in one embodiment, may perform the method outlined in FIG. 10. A subgroup selection circuit 1150 can be part of a non-volatile and/or volatile memory element 1123 (e.g., disposed on a same integrated circuit device as a non-volatile memory media 1122). In some embodiments, a memory device 1120 can at least partially operate on and/or in communication with a non-volatile and/or volatile memory system 1102 of a computing device 1110, which can comprise a processor 1111, volatile memory 1112, and a communication interface 1113. The processor 1111 can comprise one or more central processing units, one or more general-purpose processors, one or more application-specific processors, one or more virtual processors (e.g., the computing device 1110 can be a virtual machine operating within a host), one or more processor cores, or the like. The communication interface 1113 can comprise one or more network interfaces configured to communicatively couple the computing device 1110 and/or memory controller 1126 to a communication network 1115, such as an Internet Protocol (IP) network, a Storage Area Network (SAN), wireless network, wired network, or the like.

In one embodiment, a subgroup selection circuit 1150 can be disposed at or toward an edge and/or peripheral of a memory element 1123, adjacent and/or next to an array of memory media 1122 (e.g., as depicted in FIG. 11). In a further embodiment, a subgroup selection circuit 1150 can be disposed on a different level, layer, and/or plane of an integrated circuit device than an array of memory media 1122 (e.g., as CMOS or other circuit under the array, parallel with and offset from the array, or the like).

In an embodiment, the slowest subgroup for each string (e.g., four subgroups per string, as shown in FIG. 4) can be selected for program verify operations to make sure that each page is sufficiently programmed. In other embodiments, the fastest subgroup for each string can be selected for certain program operations in order to avoid over programming issues, as previously discussed. Depending on the manufacturing process used, the outer IO group is often the slowest subgroup and, in some embodiments, can be the default setting. However, due to process variations, word line dependencies, string dependencies, degradation, etc., sometimes the inner3 IO group, or another IO group, may be the slowest subgroup, as previously discussed. If the outer IO group is used but the inner3 IO group is slower, it can cause a lower tail issue for a highest data state (or for other states) where certain memory cells may not be sufficiently programmed, causing data errors (as shown in arrow 940 of FIG. 9B).

Figure 14:
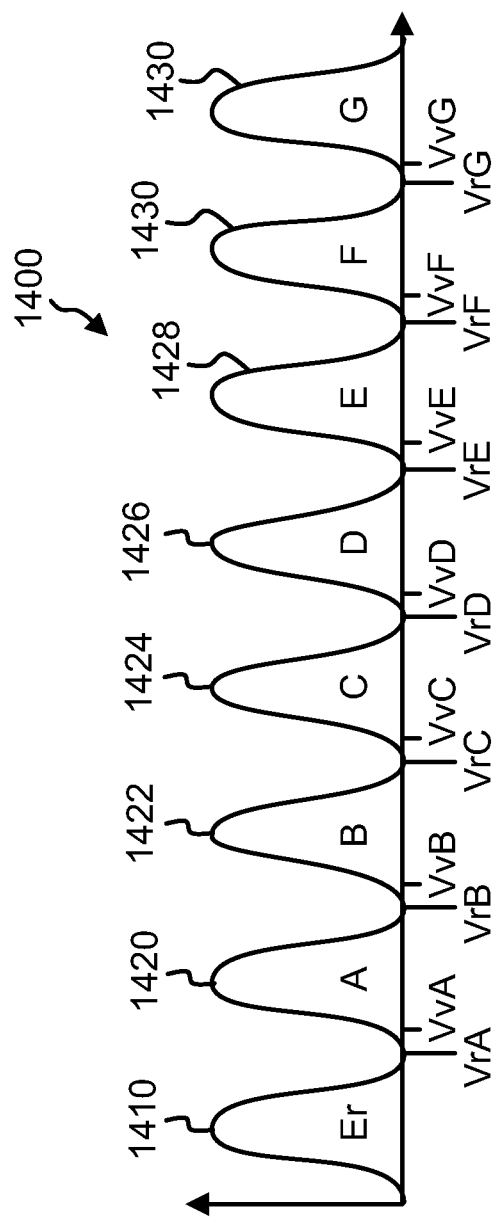
FIG. 14 illustrates an example of a threshold voltage distribution found in a multi-level flash memory cell over time in accordance with one or more implementations.

A subgroup selection circuit 1150, in certain embodiments, can determine if a number of memory cells for a plurality of subgroups (e.g., an outer IO group, an inner1 IO group, an inner2 IO group, and an inner3 IO group, as shown in FIG. 4) exceed an A state program verify level (and/or another predefined verify level) during an A-verify program operation (as shown in FIG. 14). As used herein, a verify or verification level can refer to any level associated with a particular state that may be reached during programming or erasing of a memory cell. The subgroup selection circuit 1150 can accomplish this by scanning (or counting) the number of bits (where each bit corresponds to one memory cell) that exceed the A state program verify level. A predetermined threshold number of bits can also be chosen (e.g., 100 bits). In an embodiment, the pre-determined threshold is exceeded before the subgroup selection circuit 1150 performs the next operation. For example, if it is determined that the number of memory cells (e.g., bits) that exceed the A-verify level (a programming threshold for the lowest state in a memory cell) satisfies a numeric threshold, then the subgroup selection circuit 1150 can count the number of bits for each individual subgroup above the programming threshold in order to determine which subgroup is the fastest subgroup and/or which subgroup is the slowest based on which subgroup has a greatest number of bits that exceed the A-verify level, and which subgroup has a least number of bits that exceed the A-verify level. Thereafter, the identified fastest and/or slowest subgroup subgroups can be used in a programming operation to represent all other IO groups, as previously discussed. For example, the identified slowest subgroup can be used to perform a program verify operation that is representative of all other subgroups for a whole page programming operation. In this manner, the time it takes to perform a program verify operation for a whole page programming procedure will be greatly reduced, while at the same time mitigating errors due to under programming.

The default setting (e.g., default subgroup(s) that have been identified and/or selected) can be different for each chip, die, die plane, word line, page, string, or the like and the determination of a slowest, fastest, intermediate, etc., subgroup can be separately made for each chip, die, die plane, word line, page, string, or the like. A subgroup selection circuit 1150 can also store the selection of the slowest, fastest, intermediate, etc., subgroup as a parameter for future reference (e.g., so these parameters only need to be determined once), or a subgroup selection circuit 1150 can re-determine the selection for each program operation, periodically, according to a pre-determined schedule, or the like.

In an embodiment, a subgroup selection circuit 1150 can automatically detect the correct (e.g., slowest) subgroup to use for a program verify operation and use the correct subgroup for the program verification operation dynamically for each word line. Dynamically selecting the slowest subgroup for a program verify operation, in one embodiment, can prevent or mitigate the risk of a skewed lower tail (e.g., on a highest state or other upper state, or the like), thereby reducing a failed bit count or other error indicator. In an embodiment, subgroup selection circuit 1150 can also select an optimal (e.g., slowest) IO group for program verify for different chips, die, die planes, word lines, etc., such that the process variation leading to different IO group programming speeds can be improved.

In an embodiment, a subgroup selection circuit 1150 can define a certain number of bits (e.g., 100 bits) as a numeric threshold, and can use the A-verify level (e.g., the level for A state, which may be, for example, 0.5 V as shown in FIG. 14) as the check point. The A-verify level can be chosen, for example, because it has the lowest programming threshold, and thus precedes all other verification levels when programming within a memory cell from a lower state to a higher state. However, a subgroup selection circuit 1150 can use any verify level as the check point and any number of bits as a numeric threshold. During programming, a subgroup selection circuit 1150 can also detect the subgroup which first exceeds the verify level (e.g., ≥100 bits) upon the check point (e.g., A-verify level). The other subgroups can therefore be the slower subgroups. A subgroup selection circuit 1150, can also select a subgroup group for a program verify scan, or for an overall programming process, or the like. Thus, in general a subgroup selection circuit 1150 can enable an adaptive and smart programming operation (such as an adaptive smart tier scan) which can dynamically select a slower, faster, intermediate, etc., IO group for a particular programming operation (e.g., dynamically select a slower IO group for whole page programming).

The memory device 1120, in various embodiments, can be disposed in one or more different locations relative to the computing device 1110. In one embodiment, the memory device 1120 comprises one or more non-volatile and/or volatile memory elements 1123, such as semiconductor chips or packages or other integrated circuit devices disposed on one or more printed circuit boards, storage housings, and/or other mechanical and/or electrical support structures. For example, the memory device 1120 can comprise one or more direct inline memory module (DIMM) cards, one or more expansion cards and/or daughter cards, a memory card, a universal serial bus (USB) drive, a solid-state-drive (SSD) or other hard drive device, and/or can have another memory and/or storage form factor. The memory device 1120 can be integrated with and/or mounted on a motherboard of the computing device 1110, installed in a port and/or slot of the computing device 1110, installed on a different computing device 1110 and/or a dedicated storage appliance on the network 1115, in communication with the computing device 1110 over an external bus (e.g., an external hard drive), or the like.

The memory device 1120, in one embodiment, can be disposed on a memory bus of a processor 1111 (e.g., on the same memory bus as the volatile memory 1112, on a different memory bus from the volatile memory 1112, in place of the volatile memory 1112, or the like). In a further embodiment, the memory device 1120 can be disposed on a peripheral bus of the computing device 1110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the memory device 1120 can be disposed on a data network 1115, such as an Ethernet network, an Infiniband network, SCSI RDMA over a network 1115, a storage area network (SAN), a local area network (LAN), a wide area network (WAN) such as the Internet, another wired and/or wireless network 1115, or the like.

The computing device 1110 can further comprise a non-transitory, computer readable storage medium 1114. The computer readable storage medium 1114 can comprise executable instructions configured to cause the computing device 1110 (e.g., processor 1111) to perform steps of one or more of the methods disclosed herein. In one embodiment, a subgroup selection circuit 1150 can comprise hardware of a non-volatile and/or volatile memory element 1123, computer executable program code of a device driver, firmware of a memory controller 1126 and/or a memory media controller for a memory element 1123, another electrical component, or the like. In one embodiment, a subgroup selection circuit 1150 is integrated on a memory element 1123 (e.g., an on-die subgroup selection circuit 1150 and/or other integrated hardware).

According to various embodiments, a memory controller 1126 can manage one or more memory devices 1120 and/or memory elements 1123, one or more of which can comprise an on-die subgroup selection circuit 1150. The memory device(s) 1120 can comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a memory device 1120). Memory units and/or regions can include, but are not limited to: pages, memory divisions, blocks, sectors, collections or sets of physical storage locations (e.g., logical pages, logical blocks), or the like.

A device driver and/or the memory controller 1126, in certain embodiments, can present a logical address space 1134 to the storage clients 1116. As used herein, a logical address space 1134 refers to a logical representation of memory resources. The logical address space 1134 can comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the memory device 1120 can maintain metadata 1135, such as a logical to physical address mapping structure to map logical addresses of the logical address space 1134 to media storage locations on the memory device(s) 1120. A device driver can be configured to provide storage services to one or more storage clients 1116. The storage clients 1116 can include local storage clients 1116 operating on the computing device 1110 and/or remote storage clients 1116 accessible via the network 1115 and/or network interface 1113. The storage clients 1116 can include, but are not limited to: operating systems, file systems, database applications, server applications, kernel-level processes, user-level processes, applications, and the like.

A device driver can be communicatively coupled to one or more memory devices 1120. The one or more memory devices 1120 can include different types of memory devices including, but not limited to: solid-state storage devices, semiconductor storage devices, SAN storage resources, volatile memory devices, non-volatile memory devices, or the like. The one or more memory devices 1120 can comprise one or more respective memory media controllers 1126 and memory media 1122. A device driver can provide access to the one or more memory devices 1120 via a traditional block I/O interface 1131. Additionally, a device driver can provide access to enhanced functionality through the SCM interface 1132. The metadata 1135 can be used to manage and/or track data operations performed through any of the Block I/O interface 1131, SCM interface 1132, cache interface 1133, or other related interfaces.

The cache interface 1133 can expose cache-specific features accessible via a device driver for the memory device 1120. Also, in some embodiments, the SCM interface 1132 presented to the storage clients 1116 provides access to data transformations implemented by the one or more memory devices 1120 and/or the one or more memory media controllers 1126.

A device driver can present a logical address space 1134 to the storage clients 1116 through one or more interfaces. As discussed above, the logical address space 1134 can comprise a plurality of logical addresses, each corresponding to respective media locations on one or more memory devices 1120. A device driver can maintain metadata 1135 comprising any-to-any mappings between logical addresses and media locations, or the like.

A device driver can further comprise and/or be in communication with a memory device interface 1139 configured to transfer data, commands, and/or queries to the one or more memory devices 1120 over a bus 1125, which can include, but is not limited to: a memory bus of a processor 1111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 1115, Infiniband, SCSI RDMA, or the like. The memory device interface 1139 can communicate with the one or more memory devices 1120 using input-output control (IO-CTL) command(s), IO-CTL command extension(s), remote direct memory access, or the like.

The communication interface 1113 can comprise one or more network interfaces configured to communicatively couple the computing device 1110 and/or the memory controller 1126 to a network 1115 and/or to one or more remote, network-accessible storage clients 1116. The storage clients 1116 can include local storage clients 1116 operating on the computing device 1110 and/or remote storage clients 1116 accessible via the network 1115 and/or the network interface 1113. The memory controller 1126 is part of and/or in communication with one or more memory devices 1120. Although FIG. 11 depicts a single memory device 1120, the disclosure is not limited in this regard and could be adapted to incorporate any number of memory devices 1120, a combination of one or more volatile memory devices 1120 and one or more non-volatile memory devices 1120, or the like.

The memory device 1120 can comprise one or more elements 1123 of memory media 1122. In one embodiment, an element 1123 of memory media 1122 comprises a volatile memory medium 1122, such as random-access memory (RAM), dynamic RAM (DRAM), synchronous DRAM (SDRAM), double data rate (DDR) SDRAM, static RAM (SRAM), thyristor RAM (T-RAM), zero-capacitor RAM (Z-RAM), or the like. In certain embodiments, an element 1123 of memory media 1122 comprises a non-volatile memory medium 1122, such as ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS) memory, programmable metallization cell (PMC) memory, conductive-bridging RAM (CBRAM), magneto-resistive RAM (MRAM), magnetic storage media (e.g., hard disk, tape), optical storage media, or the like. Thus, the memory device 1120 may rely, for example, on stored voltage levels or stored resistance levels. The one or more elements 1123 of memory media 1122, in certain embodiments, comprise storage class memory (SCM).

While legacy technologies such as NAND flash can be block and/or page addressable, storage class memory, in one embodiment, is byte addressable. In further embodiments, storage class memory can be faster and/or have a longer life (e.g., endurance) than NAND flash; can have a lower cost, use less power, and/or have a higher storage density than DRAM; or offer one or more other benefits or improvements when compared to other technologies. For example, storage class memory can comprise one or more non-volatile memory elements 1123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 1122 is referred to herein as "memory media," in various embodiments, the non-volatile memory media 1122 can more generally comprise one or more non-volatile recording media capable of recording data, which can be referred to as a non-volatile memory medium, a non-volatile storage medium, or the like. Further, the non-volatile memory device 1120, in various embodiments, can comprise a non-volatile recording device, a non-volatile memory device, a non-volatile storage device, or the like. Similarly, a non-volatile memory element 1123, in various embodiments, can comprise a non-volatile recording element, a non-volatile memory element, a non-volatile storage element, or the like.

The non-volatile memory media 1122 can comprise one or more non-volatile memory elements 1123, which can include, but are not limited to: chips, packages, planes, die, or the like. A non-volatile memory controller 1126 can be configured to manage data operations on the non-volatile memory media 1122, and can comprise one or more processors, programmable processors (e.g., FPGAs), ASICs, micro-controllers, or the like. In some embodiments, the non-volatile memory controller 1126 is configured to store data on and/or read data from the non-volatile memory media 1122, to transfer data to/from the non-volatile memory device 1120, and so on.

The non-volatile memory controller 1126 can be communicatively coupled to the non-volatile memory media 1122 by way of a bus 1127. The bus 1127 can comprise an I/O bus for communicating data to/from the non-volatile memory elements 1123. The bus 1127 can further comprise a control bus for communicating addressing, and other command and control information to the non-volatile memory elements 1123. In some embodiments, the bus 1127 can communicatively couple the non-volatile memory elements 1123 to the non-volatile memory controller 1126 in parallel. This parallel access can allow the non-volatile memory elements 1123 to be managed as a group, forming a logical memory element 1129. The logical memory element can be partitioned into respective logical memory units (e.g., logical pages) and/or logical memory divisions (e.g., logical blocks). The logical memory units can be formed by logically combining physical memory units of each of the non-volatile memory elements.

The non-volatile memory controller 1126 can comprise and/or be in communication with a device driver executing on the computing device 1110. A device driver can provide storage services to the storage clients 1116 via one or more interfaces 1131, 1132, and/or 1133. In some embodiments, a device driver provides a block-device I/O interface 1131 through which storage clients 1116 perform block-level I/O operations. Alternatively, or in addition, a device driver can provide a storage class memory (SCM) interface 1132, which can provide other storage services to the storage clients 1116. In some embodiments, the SCM interface 1132 can comprise extensions to the block device interface 1131 (e.g., storage clients 1116 can access the SCM interface 1132 through extensions or additions to the block device interface 1131). Alternatively, or in addition, the SCM interface 1132 can be provided as a separate API, service, and/or library. A device driver can be further configured to provide a cache interface 1133 for caching data using the non-volatile memory system 1102. A device driver can further comprise a non-volatile memory device interface 1139 that is configured to transfer data, commands, and/or queries to the non-volatile memory controller 1126 over a bus 1125, as described above.

Figure 12:
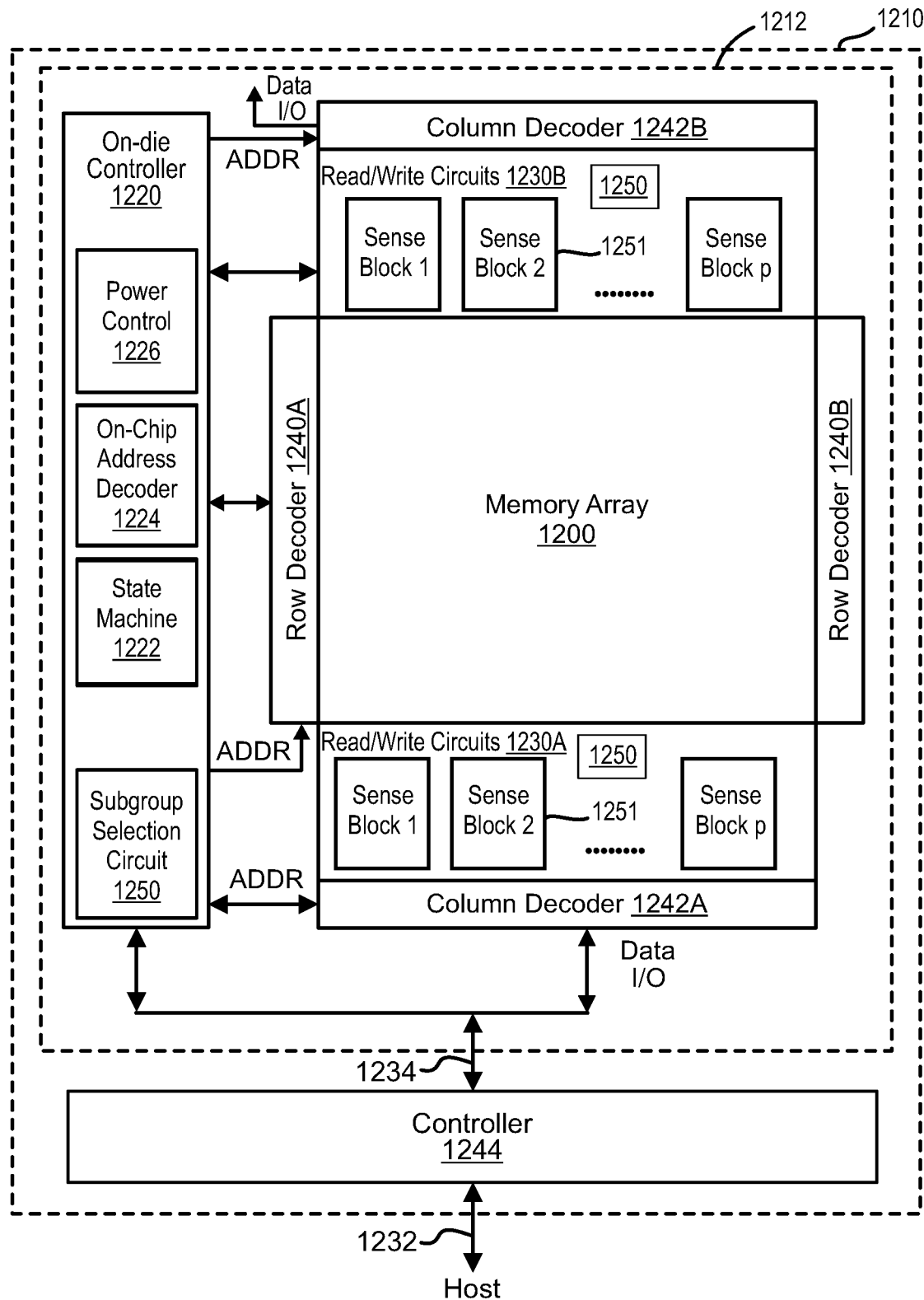
FIG. 12 is a schematic block diagram illustrating a device for memory cell subgroup identification and selection.

FIG. 12 is a schematic block diagram illustrating an embodiment of a non-volatile storage device 1210 for memory cell subgroup identification and selection. The non-volatile storage device 1210 can include one or more memory die or chips 1212, with one or more subgroup selection circuits 1250. These subgroup selection circuits 1250 may perform the same functions and variation discussed in connection with the subgroup selection circuits 1150 of FIG. 11. A "memory die" comprises a block of semiconducting material on which a memory circuit is fabricated and, as used herein, also includes the memory circuit disposed thereon. The non-volatile storage device 1210 can be substantially similar to the computing device 1110 described with reference to FIG. 11. While the one or more subgroup selection circuits 1250 of FIG. 12 are depicted toward a periphery of the memory die or chip 1212 (e.g., on a same physical level as the memory array 1200 in an integrated circuit device), in other embodiments, one or more subgroup selection circuits 1250 can be disposed on a different physical level of the memory die and/or chip 1212 than the memory array 1200 (e.g., parallel to and offset from a level of the memory array 1200 in an integrated circuit device). In one embodiment, a subgroup selection circuit 1250 can be part of an on-die controller 1220. In a further embodiment, a subgroup selection circuit 1250 can be part of read/write circuits 1230A-B, a row decoder circuits 1240A-B, a column decoder circuits 1242A-B, or the like.

The memory die 1212, in some embodiments, includes an array 1200 (e.g., two-dimensional or three dimensional) of memory cells, an on-die controller 1220, and read/write circuits 1230A/1230B. In one embodiment, access to the memory array 1200 by the various peripheral circuits is implemented in a symmetric fashion, on opposite sides of the memory array 1200, so that the densities of access lines and circuitry on each side are reduced by half. The read/write circuits 1230A/1230B, in a further embodiment, include multiple sense blocks 1251 which allow a page of memory cells to be read or programmed in parallel.

The memory array 1200, in various embodiments, is addressable by word lines via row decoder circuits 1240A/1240B and by bit lines via column decoder circuits 1242A/1242B. In some embodiments, a controller 1244 is included in the same memory device 1210 (e.g., a removable storage card or package) as the one or more memory die 1212. Commands and data are transferred between the host and controller 1244 via lines 1232 and between the controller and the one or more memory die 1212 via lines 1234. One implementation can include multiple chips 1212.

On-die controller 1220, in one embodiment, cooperates with the read/write circuits 1230A/1230B to perform memory operations on the memory array 1200. The on-die controller 1220, in certain embodiments, includes a state machine 1222, an on-chip address decoder 1224, and a power control circuit 1226. In one embodiment, the on-chip address decoder 1224 and/or the power control circuit 1226 can be part of and/or controlled by the controller 1244.

The state machine 1222, in one embodiment, provides chip-level control of memory operations. The on-chip address decoder 1224 provides an address interface to convert between the address that is used by the host or a memory controller to the hardware address used by the decoder circuits 1240A, 1240B, 1242A, 1242B. The power control circuit 1226 controls the power and voltages supplied to the word lines and bit lines during memory operations. In one embodiment, the power control circuit 1226 includes one or more charge pumps that can create voltages larger than the supply voltage.

In one embodiment, one or any combination of the on-die controller 1220, state machine 1222, power control circuit 1226, on-chip address decoder 1224, decoder circuit 1242A, decoder circuit 1242B, decoder circuit 1240A, decoder circuit 1240B, read/write circuits 1230A, read/write circuits 1230B, and/or controller 1244 can be referred to as one or more managing circuits.

Figure 13:
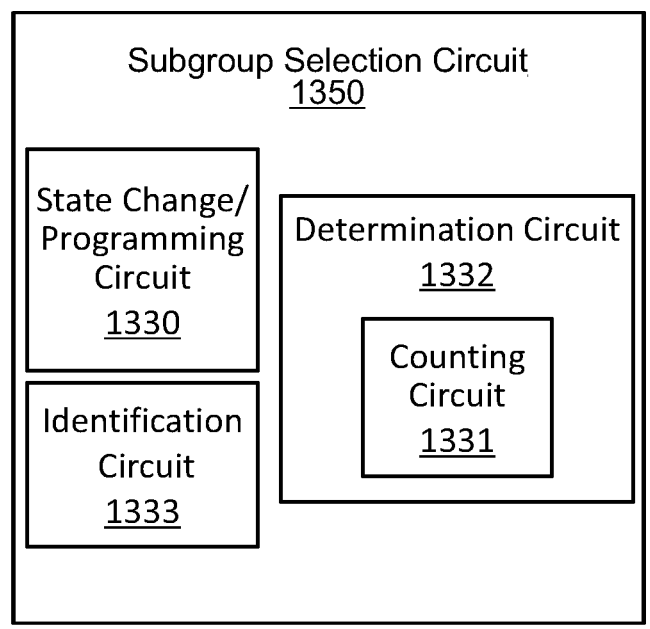
FIG. 13 is a block diagram illustrating an embodiment of subgroup selection circuit.

FIG. 13 is a block diagram illustrating an embodiment of a subgroup selection circuit 1350. The subgroup selection circuit 1350, as indicated in connection with the subgroup selection circuits of FIGS. 11 and 12, may be positioned at various locations on a memory die or chip and may perform various functions in connection with the identification of a subgroup having a particular programming characteristic or state change characteristic. The subgroup selection circuit 1350 illustrated in FIG. 13 includes a state change/programming circuit 1330, a counting circuit 1331, a determination circuit 1332, and an identification circuit 1333.

As used herein, a "state change circuit" or "programming circuit" refers to any circuit utilized to execute or deliver one or more program loops. For example, a programming circuit may perform step 1010 of FIG. 10. As used herein, a "counting circuit" refers to a circuit that counts a total number of memory cells that satisfy a programming threshold during a program verify operation within each subgroup and/or a total number of memory cells in all subgroups that satisfy a programming threshold. By way of example, a counting circuit may perform steps 1020 or 1040 of FIG. 10.

As used herein, a "determination circuit" refers to any circuit that computes, calculates, factors, or determine a relative rate of state change for two or more subgroups of memory cells. For example, each memory cell has a data state comprising at least a first data state (e.g. a higher or lower data state) and a second data state (e.g., a higher or lower data state). A determination circuit may determine which subgroup of memory cells from a set of subgroups of memory cells transitions more rapidly from a first state to a second state or from a second state to a first state.

In certain embodiments, a changeable characteristic of a memory cell is used to represent or store a data value (e.g. a binary 1 or a binary 0). If the changeable characteristic of the memory cell can be in more than two distinct values/settings, then the memory cell can be used to store a multi-bit data value. Each distinct value for the characteristic of a memory cell is referred to herein as a data state. For example, in one embodiment, a threshold voltage level or a threshold resistance level of in the memory cell may comprise a data state.

In certain embodiments, the relationship between data states and the characteristics is linear. Thus, a first data state may be higher than a second data state if the first data state comprises a higher threshold voltage level than the threshold voltage level represented by the second data state. A state change occurs when the data state of a memory cell changes from one data state to another data state (or to an intermediate data state). In certain embodiments, one data state is considered lower than another because its respective threshold voltage level is lower than the other data state. Moving from a lower data state to a higher data state may involve, for example, transitioning from a lower threshold voltage level stored in a memory cell to a higher threshold voltage level. Moving from a lower data state to a higher data state could also involve, for example, transitioning from a lower threshold resistance level to a higher threshold resistance level. A state change may also involve transitioning from a higher data state to a lower data state, for example, during an erasing procedure.

In embodiments of this solution, one goal is to determine a rate of state change for groups of memory cells. A rate of state change is a measure of how a memory cell's state changes (e.g., the magnitude of the change) over a given number of programming pulses or erase pulses. Thus, a relative rate of state change for a subgroup of memory cells is an indication of how fast or slow a subgroup of memory cells changes from one data state to another data state relative to at least one other subgroup of memory cells that undergoes a similar set of programming or erase pulses. For example, a determination circuit may perform the steps 1020, 1030, 1040 illustrated in FIG. 10. As used herein, an "identification circuit" refers to a circuit utilized to identify a programming speed for a subgroup of memory cells in relation to at least one other subgroup of memory cells. For example, an identification circuit may be utilized perform the steps identified in step 1050 of FIG. 10.

In an embodiment, the state change/programming circuit 1330 is configured to alter a data state of each of the memory cells by delivering (or supplying) program loops to at least some of the memory cells in the memory array. In other words, the state change/programming circuit 1330 is configured to apply one or more programming pulses to the array of memory cells to program the memory cells to a target data state. A target data state can be any desired data state of a memory cell, or subgroup of memory cells. Each program loop encompasses a single program pulse and extends until a subsequent program pulse is sent. For example, the state change/programming circuit 1330 sends a series of program pulses to a selected word line coupled to memory cells of the memory array. The program pulses can increase in amplitude (e.g., increase in voltage in a linear or non-linear manner) over a number of programming cycles to progressively (or incrementally) increase the threshold voltages of the memory cells (e.g., a threshold voltage in a flash configuration or a resistive state in a resistive memory configuration) to states corresponding to data being stored. The term "progressively" or "incrementally" means occurring in steps over time (e.g., over a number of program loops).

In an embodiment, the counting circuit 1331 is configured to count a total number of memory cells within a group of memory cells that satisfy a programming threshold in order to determine whether the total number of memory cells satisfies a numeric threshold. This counting process can occur during or after a program verify operation. The programming threshold can be, for example, an A state program verify level, or any other verify level. The numeric threshold can be any pre-determined number (such as a pre-determined positive integer number), or any number that is derived (such as a percentage of the memory cells within a given group or subgroup of memory cells).

In an embodiment, it is determined that a number of memory cells that satisfy (e.g., reached or exceeded) a programming threshold is greater than (e.g., exceeded) a numeric threshold before the counting circuit 1331, the determination circuit 1332, and/or the identification circuit 1333 perform their respective operations. In this manner, certain subsequent operations to be performed by the counting circuit 1331, the determination circuit 1332, and/or the identification circuit 1333 can be delayed/avoided until a sufficient sample size of memory cells that satisfy the programming threshold is obtained. For example, if it is determined that the number of memory cells that exceed a programming threshold satisfies the numeric threshold, then the counting circuit 1331 can proceed to count the number of memory cells in each individual subgroup of memory cells that satisfies the programming threshold. The determination circuit 1332, and/or the identification circuit 1333 can also proceed to determine/identify a relative rate of state change (e.g., a programming speed) for at least one subgroup of memory cells, as previously discussed. In an embodiment, if it is determined that a number of memory cells that satisfies a programming threshold satisfies than the numeric threshold (e.g., the number of memory cells that satisfy the programming threshold is greater, or less, than the numeric threshold), then the counting circuit 1331 can proceed to count a first number of cells of a first subgroup that satisfy the programming threshold, and count a second number of cells of a second subgroup that satisfy the programming threshold.

In an embodiment, the determination circuit 1332 is configured to determine a relative rate of state change for at least two subgroups of memory cells. For example, a relative rate of state change for a subgroup of memory cells can be characterized numerically (e.g., by a number of memory cells in a first subgroup of memory cells that satisfy a programming threshold relative to a number of memory cells in a second subgroup of memory cells that satisfy the programming threshold), or via a suitable label/state change characteristic (e.g., a fastest subgroup of memory cells, a slowest subgroup of memory cells, an intermediate subgroup of memory cells, etc.).

In an embodiment, the identification circuit 1333 is configured to identify a subgroup of memory cells that satisfies a state change characteristic based on the relative rate of state change for at least two subgroups of memory cells. For example, it can be desirable to identify and select a particular subgroup of memory cells having a certain state change characteristic (e.g., a fastest/slowest/intermediate subgroup of memory cells as pertaining to programming speed) in order to complete a programming operation (e.g., a program verify operation). In this embodiment, the identification circuit 1333 can identify a subgroup of memory cells that satisfies the desired state change characteristic and/or select the identified subgroup of memory cells for utilization during a programming operation (e.g., utilize the identified subgroup for verification steps of a programming operation).

In an embodiment, the identification circuit 1333 is configured to identify a first subgroup as a fastest memory cell subgroup and a second subgroup as a slowest memory cell subgroup in response to a first number of cells of the first subgroup that satisfy a threshold (e.g., a program verify level) being greater than a second number of cells of the second subgroup that satisfy the threshold.

In an embodiment, the identification circuit 1333 is configured to identify at least one of: (1) a fastest subgroup of memory cells when the state change/programming circuit 1330 alters the data state of at least some memory cells from a lower data state to a higher data state; and (2) a slowest subgroup of memory cells when the state change/programming circuit 1330 alters the data state of at least some of the memory cells from a lower data state to a higher data state (or to an intermediate data state).

In an embodiment, the identification circuit 1333 is configured to identify at least one subgroup of memory cells that satisfies a state change characteristic (e.g., a fastest/slowest/intermediate subgroup of memory cells) during each programming operation (e.g., during each program verify operation). This can be useful in certain scenarios, such as: (1) where a tradeoff between data accuracy and an overall speed of the memory device favors data accuracy; (2) once the memory device has entered its "end of use," or "end of projected life span" period (e.g., so many write cycles have been completed by the memory device, such as a certain number of Terabytes been written to the memory device); and (3) if a certain number or percentage of data errors begin to be detected by the memory device.

However, it will also be understood that in other embodiments the identification circuit 1333 can be configured to identify at least one subgroup of memory cells that satisfies a state change characteristic according to a pre-determined schedule. For example, a pre-determined schedule can comprise: (1) once at the time of manufacture or initial testing of the memory device; or (2) periodically (e.g., after a number of program operations have been completed, after a period of time has elapsed, and the like).

An embodiment of an apparatus disclosed herein includes a plurality of memory cells and a state change circuit configured to alter a data state of each of the memory cells. The apparatus further includes a determination circuit configured to determine a relative rate of state change for two subgroups of memory cells and an identification circuit configured to identify a subgroup of memory cells that satisfies a state change characteristic based on the relative rate of state change.

In an embodiment of the apparatus, the identified subgroup of memory cells that satisfies the state change characteristic can include at least one of a fastest subgroup of memory cells and a slowest subgroup of memory cells. In an embodiment of the apparatus, the data state of each of the memory cells includes at least a lower data state and a higher data state. The identification circuit is also configured to identify at least one of: a fastest subgroup of memory cells when the state change circuit alters the data state of at least some of the memory cells from the lower data state to the higher data state, and a slowest subgroup of memory cells when the state change circuit alters the data state of at least some of the memory cells from the lower data state to the higher data state.

In an embodiment of the apparatus, the apparatus further includes a counting circuit configured to count a total number of memory cells that satisfy a programming threshold and determine whether the total number satisfies a numeric threshold. The identification circuit is also configured to identify the subgroup of memory cells that satisfies the state change characteristic in response to the total number of memory cells that satisfy the programming threshold being greater than the numeric threshold. In an embodiment of the apparatus, the numeric threshold includes at least one of a pre-determined number and a percentage of the memory cells.

In an embodiment of the apparatus, the identification circuit is configured to identify the subgroup of memory cells according to a pre-determined schedule. In an embodiment of the apparatus, the identified subgroup of memory cells comprises a tier group.

An embodiment of a non-volatile memory storage system includes an array of memory cells organized into multiple subgroups and a programming circuit configured to apply one or more programming pulses to the array of memory cells to program the memory cells to a target data state. The non-volatile memory storage system also includes a counting circuit configured to count a first number of cells of a first subgroup that satisfy a threshold and count a second number of cells of a second subgroup that satisfy the threshold, as well as an identification circuit configured to identify the first subgroup as a fastest memory cell subgroup and the second subgroup as a slowest memory cell subgroup in response to the first number of cells being greater than the second number of cells.

In an embodiment of the non-volatile memory storage system, the identification circuit is further configured to identify at least one intermediate programming speed memory cell subgroup.

In an embodiment of the non-volatile memory storage system, the target data state of the memory cells includes at least one of a lower data state and a higher data state. The identification circuit is further configured to identify at least one of: the fastest memory cell subgroup when the programming circuit programs the memory cells from the lower data state to the higher data state, and the slowest memory cell subgroup when the programming circuit programs the memory cells from the lower data state to the higher data state.

In an embodiment of the non-volatile memory storage system, the identification circuit is configured to identify the fastest memory cell subgroup and the slowest memory cell subgroup during each programming procedure. In an embodiment of the non-volatile memory storage system, the identification circuit is configured to identify the fastest memory cell subgroup and the slowest memory cell subgroup according to a pre-determined schedule. In an embodiment of the non-volatile memory storage system, the fastest memory cell subgroup and the slowest memory cell subgroup comprise tier groups.

In an embodiment of a memory apparatus, the memory apparatus is configured to apply one or more programming pulses to subgroups of memory cells in a programming operation. The memory apparatus is further configured to count a total number of the memory cells that satisfy a programming threshold, determine whether the total number is greater than a numeric threshold, and determine a number of memory cells within each subgroup that satisfy the programming threshold in response to determining that the total number is greater than the numeric threshold. The memory apparatus is further configured to identify at least one of a fastest programming subgroup and a slowest programming subgroup based on the determined number of memory cells within each subgroup and utilize the identified subgroup for verification steps of the programming operation.

In an embodiment of the memory apparatus, applying the one or more programming pulses to subgroups of memory cells in the programming operation alters a data state of at least some of the memory cells where the data state includes at least a lower data state and a higher data state. Identifying the at least one of the fastest programming subgroup and the slowest programming subgroup further includes at least one of: identifying the fastest programming subgroup when the programming operation alters the data state of at least some of the memory cells from the lower data state to the higher data state, and identifying the slowest programming subgroup when the programming operation alters the data state of at least some of the memory cells from the lower data state to the higher data state.

In an embodiment of the memory apparatus, the memory apparatus further includes identifying an intermediate programming speed subgroup based on the determined number of memory cells within each subgroup. In an embodiment of the memory apparatus, identifying the at least one of the fastest programming subgroup and the slowest programming subgroup is performed during each programming operation. In an embodiment of the memory apparatus, identifying the at least one of the fastest programming subgroup and the slowest programming subgroup is performed according to a pre-determined schedule. In an embodiment of the memory apparatus, the identified subgroup comprises a tier group.

FIG. 14 illustrates an example of voltage distributions 1400 found in multi-level flash memory cells over time in accordance with one or more implementations. The voltage distributions 1400 shown in FIG. 14 have been simplified for illustrative purposes.

The set of memory cells associated with the voltage distributions 1400 are connected to a word line, after a programming operation, where eight data states are used. A Vth distribution 1410 is provided for erased (Er) state memory cells. Vth distributions 1420, 1422, 1424, 1426, 1428, 1430 and 1432 represent assigned data states A, B, C, D, E, F and G, respectively, which are reached by memory cells when their threshold voltage (Vth) exceeds program verify voltages VvA, VvB, VvC, VvD, VvE, VvF or VvG, respectively. Read voltages VrA, VrB, VrC, VrD, VrE, VrF and VrG are used to read data from a set of cells having this Vth distribution.

With eight data states, or three bits per cell, three pages of data can be stored. An example encoding of bits for the A, B, C, D, E, F and G states is 111, 110, 100, 000, 010, 011, 001 and 101, respectively. The data of the lower page can be determined by reading the memory cells using read voltages of VrA and VrE. The data of the middle page can be determined by reading the memory cells using read voltages of VrB, VrD and VrF. The data of the upper page can be determined by reading the memory cells using read voltages of VrC and VrG.

The read voltages VrA, VrB, VrC, VrD, VrE, VrF and VrG are positioned between adjacent center voltages (e.g., positioned at or near the halfway point between adjacent center voltages) and, thus, define threshold voltages between the voltage ranges 1410, 1420, 1422, 1424, 1426, 1428, 1430 and 1432. During a read operation, one of the read voltages VrA, VrB, VrC, VrD, VrE, VrF and VrG is applied to determine the cell voltage using a comparison process. However, due to the various factors, the actual cell voltage, and/or the cell voltage received when reading the MLC, may be different from a respective center voltage corresponding to the data value written into the cell. For example, the actual cell voltage may be in an altogether different voltage range, strongly indicating that the MLC is storing a different bit-tuple than was written to the MLC. More commonly, the actual cell voltage may be close to one of the read voltages, making it difficult to determine with certainty which of two adjacent bit-tuples is stored by the MLC.

FIG. 14 illustrates eight different memory states, which correspond to TLC. However, the disclosed subject matter may be implemented in connection with memory cells having any number of data states, such as SLC, MLC or QLC. In one embodiment, "programming threshold" or "threshold" may comprise a lowest verification or verify level, such as an A-verify level (e.g., VvA), irrespective of the number of states that may be stored in each memory cell. As noted above, a "programming threshold" or "threshold" may be associated with or unassociated with programming or erasing verification level, which may also be referred to as a verify level or verification level.

The present disclosure can be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus comprising:
    a plurality of memory cells;
    a state change circuit configured to alter a data state of each of the memory cells configured to be programmed;
    a determination circuit configured to determine a relative rate of state change for at least two subgroups of memory cells; and
    an identification circuit configured to identify a subgroup of memory cells that satisfies a state change characteristic based on the relative rate of state change.

2. The apparatus of claim 1, wherein the identified subgroup of memory cells that satisfies the state change characteristic comprises at least one of:
    a fastest subgroup of memory cells; and
    a slowest subgroup of memory cells.

3. The apparatus of claim 2, wherein:
    the data state of each of the memory cells comprises at least:
        a lower data state; and
        a higher data state higher than the lower data state; and
    the identification circuit is further configured to identify at least one of:
        a fastest subgroup of memory cells when the state change circuit alters the data state of at least some of the memory cells from the lower data state to the higher data state; and
        a slowest subgroup of memory cells when the state change circuit alters the data state of at least some of the memory cells from the lower data state to the higher data state.

4. The apparatus of claim 1, further comprising a counting circuit configured to count a total number of memory cells that satisfy a programming threshold and determine whether the total number of memory cells satisfies a numeric threshold, and wherein the identification circuit is configured to identify the subgroup of memory cells that satisfies the state change characteristic in response to the total number of memory cells that satisfy the programming threshold being greater than the numeric threshold.

5. The apparatus of claim 4, wherein the numeric threshold comprises at least one of:
    a pre-determined number; and
    a percentage of the memory cells.

6. The apparatus of claim 1, wherein the identification circuit is configured to identify the subgroup of memory cells during each programming procedure.

7. The apparatus of claim 1, wherein the identification circuit is configured to identify the subgroup of memory cells according to a pre-determined schedule.

8. The apparatus of claim 1, wherein the identified subgroup of memory cells comprises a tier group.

9. A non-volatile memory storage system comprising:
    an array of memory cells organized into multiple subgroups;
    a programming circuit configured to apply one or more programming pulses to the array of memory cells to program the memory cells to a target data state;
    a counting circuit configured to count a first number of cells of a first subgroup that satisfy a threshold and count a second number of cells of a second subgroup that satisfy the threshold; and
    an identification circuit configured to identify the first subgroup as a fastest memory cell subgroup and the second subgroup as a slowest memory cell subgroup in response to the first number of cells being greater than the second number of cells.

10. The non-volatile memory storage system of claim 9, wherein the identification circuit is further configured to identify at least one intermediate programming speed memory cell subgroup.

11. The non-volatile memory storage system of claim 9, wherein:
    the target data state of the memory cells comprises at least one of:
        a lower data state; and
        a higher data state higher than the lower data state; and the identification circuit is further configured to identify at least one of:
   the fastest memory cell subgroup when the programming circuit programs the memory cells from the lower data state to the higher data state; and
   the slowest memory cell subgroup when the programming circuit programs the memory cells from the lower data state to the higher data state.

12. The non-volatile memory storage system of claim 9, wherein the identification circuit is configured to identify the fastest memory cell subgroup and the slowest memory cell subgroup during each programming procedure.

13. The non-volatile memory storage system of claim 9, wherein the identification circuit is configured to identify the fastest memory cell subgroup and the slowest memory cell subgroup according to a pre-determined schedule.

14. The non-volatile memory storage system of claim 9, wherein the fastest memory cell subgroup and the slowest memory cell subgroup comprise tiers.

15. A memory apparatus configured to:
   apply one or more programming pulses to subgroups of memory cells in a programming operation;
   count a total number of the memory cells that satisfy a programming threshold;
   determine whether the total number is greater than a numeric threshold;
   determine a number of memory cells within each subgroup that satisfy the programming threshold in response to determining that the total number is greater than the numeric threshold;
   identify at least one of a fastest programming subgroup and a slowest programming subgroup based on the determined number of memory cells within each subgroup; and
   utilize the identified subgroup for subsequent verification steps of the programming operation.

16. The memory apparatus of claim 15, wherein:
   applying the one or more programming pulses to subgroups of memory cells in the programming operation alters a data state of at least some of the memory cells, the data state comprising at least:
   a lower data state; and
   a higher data state higher than the lower data state; and
   identifying the at least one of the fastest programming subgroup and the slowest programming subgroup further comprises at least one of:
      identifying the fastest programming subgroup when the programming operation alters the data state of at least some of the memory cells from the lower data state to the higher data state; and
      identifying the slowest programming subgroup when the programming operation alters the data state of at least some of the memory cells from the lower data state to the higher data state.

17. The memory apparatus of claim 15, further comprising identifying an intermediate programming speed subgroup based on the determined number of memory cells within each subgroup.

18. The memory apparatus of claim 15, wherein identifying the at least one of the fastest programming subgroup and the slowest programming subgroup is performed during each programming operation.

19. The memory apparatus of claim 15, wherein identifying the at least one of the fastest programming subgroup and the slowest programming subgroup is performed according to a pre-determined schedule.

20. The memory apparatus of claim 15, wherein the programming threshold comprises a programming verification level.

* * * * *